United States Patent [19]

Tults

[11] 4,442,547
[45] Apr. 10, 1984

[54] COUNTER ARRANGEMENT USEFUL IN A FREQUENCY LOCKED LOOP TUNING SYSTEM FOR MEASURING THE FREQUENCY OF A LOCAL OSCILLATOR SIGNAL

[75] Inventor: Juri Tults, Indianapolis, Ind.

[73] Assignee: RCA Corporation, New York, N.Y.

[21] Appl. No.: 413,768

[22] Filed: Sep. 1, 1982

[51] Int. Cl.³ .......................... H04B 1/16; H04N 5/44
[52] U.S. Cl. .................................. 455/180; 455/183; 358/191.1
[58] Field of Search ............... 455/179, 180, 183, 184, 455/165; 358/191.1

[56] References Cited

U.S. PATENT DOCUMENTS

| | | | |
|---|---|---|---|
| 3,961,266 | 6/1976 | Tanaka . | |
| 4,088,959 | 5/1978 | Sumi | 455/183 |
| 4,109,283 | 8/1978 | Rast . | |
| 4,121,162 | 10/1978 | Alberkrack et al. . | |
| 4,305,157 | 12/1981 | Mogi | 455/183 |

*Primary Examiner*—Jin F. Ng
*Attorney, Agent, or Firm*—Eugene M. Whitacre; Paul J. Rasmussen; Peter M. Emanuel

[57] ABSTRACT

A counter arrangement for measuring the frequency of a local oscillator signal produced in a television tuning system includes a main down counter and an auxiliary down counter. Prior to a measurement interval, the channel number of the selected channel is loaded into the main down counter and a number which is related to the frequency separation, S, in mHz, between the channels by the relationship:

$$PS+P$$

where P is an integer greater than zero, is loaded into the auxiliary down counter. During the measurement interval, the main counter is enabled to count down from the channel number in response to the local oscillator signal. Each time the count of the main counter equals zero, the count in the auxiliary counter is reduced by one and the channel number is again loaded into the main counter. When the count in the auxiliary counter equals P, a band dependent number is loaded into the main counter. Thereafter, each time the count of the main counter equals zero the band dependent number is again loaded into the main counter and the count of the auxiliary counter is again reduced by one until the count of the auxiliary counter equals one. After the end of the measurement interval the count in the main counter is examined to generate an error signal from which a tuning voltage for the tuning system is generated.

6 Claims, 15 Drawing Figures

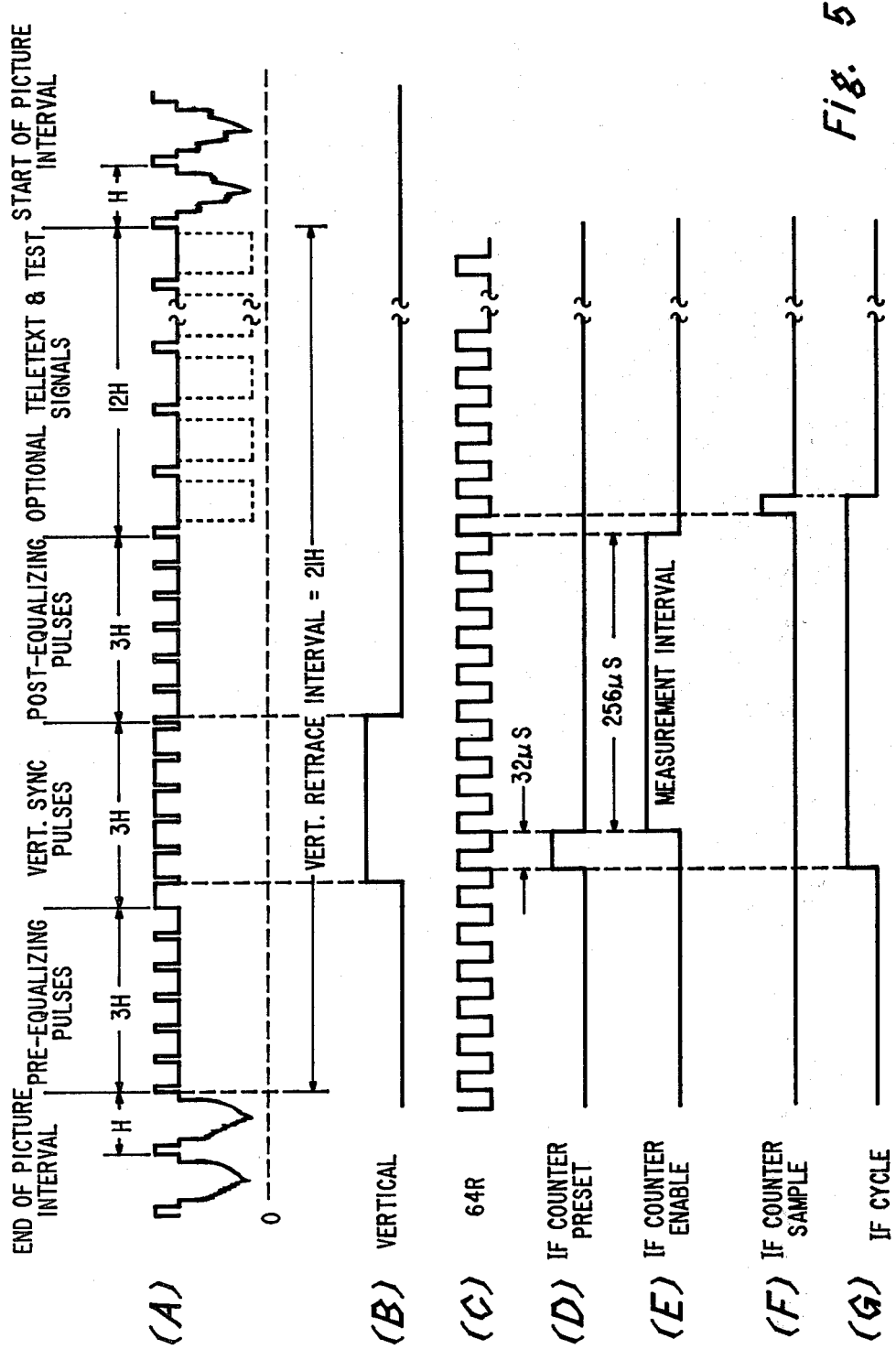

COUNTER ARRANGEMENT USEFUL IN A FREQUENCY LOCKED LOOP TUNING SYSTEM FOR MEASURING THE FREQUENCY OF A LOCAL OSCILLATOR SIGNAL

The present invention pertains to the field of digital frequency locked loop tuning systems and, more particularly, pertains to a counter arrangement for measuring the frequency of a local oscillator signal In concurrently filed U.S. Pat. application Ser. No. 413,769 filed in the name of the same inventor and having the same assignee as the present application, there is described a frequency locked loop tuning system for a television receiver in which a counter arrangement is employed to measure the frequency of a local oscillator signal in order to derive a tuning voltage for controlling the frequency of the local oscillator signal to establish it at the appropriate value for a corresponding selected channel. In the counter arrangement, a number corresponding to the selected channel is loaded into a counter prior to a measurement interval. Thereafter, during the measurement interval, the counter is enabled to count down from the number loaded into it. After the end of the measurement interval, the count of the counter is examined to derive error signals which are utilized to generate the tuning voltage.

The number loaded into the counter of the above-described counting arrangement depends on the channel number. In the described system, a read-only memory (ROM) stores the appropriate number for each channel which may be selected. It will be appreciated that because of the large number of available broadcast and cable channels, the number of memory cells in the ROM is relatively large. The large size of the ROM adds significant cost to the system.

The present invention concerns an arrangement which makes possible a significant reduction of the size of the ROM employed in the above-described system. It takes advantage of the fact that within each band of the television range the channels are separated at uniform frequency intervals. As a result, the frequency of the local oscillator signal, $f_{LO}$, may be expressed by the following relationship:

$$f_{LO} = \text{(channel number)(frequency spacing)} + \text{(a band dependent constant)}$$

Specifically, in a preferred embodiment, the counter arrangement includes a main down counter and an auxiliary down counter. Prior to the measurement interval, the channel number is loaded into the main down counter and a number which is related to the frequency separation, S, in mHz, between the channels by the relationship:

$$PS + P$$

where P is an integer greater than zero, is loaded into the auxiliary down counter. During the measurement interval, the main counter is enabled to count down from the channel number in response to the local oscillator signal. Each time the count of the main counter equals zero, the count in the auxiliary counter is reduced by one and the channel number is again loaded into the main counter. When the count in the auxiliary counter equals P, a band dependent constant is loaded into the main counter. Thereafter, each time the count of the main counter equals zero the band dependent number is again loaded into the main counter and the count of the auxiliary counter is again reduced by one until the count of the auxiliary counter equals one. After the end of the measurement interval the count in the main counter is examined to generate an error signal from which the tuning voltage is generated.

The present invention will be explained with reference to the accompanying Drawing in which:

FIGS. 4a, 5a and 6a show graphical representations of various waveforms useful in understanding the operation of the structures shown in FIGS. 2, 3, 4, 5 and 6;

In the FIGURES lines between blocks with cross-marks indicate multiple signal paths.

Figure 1:
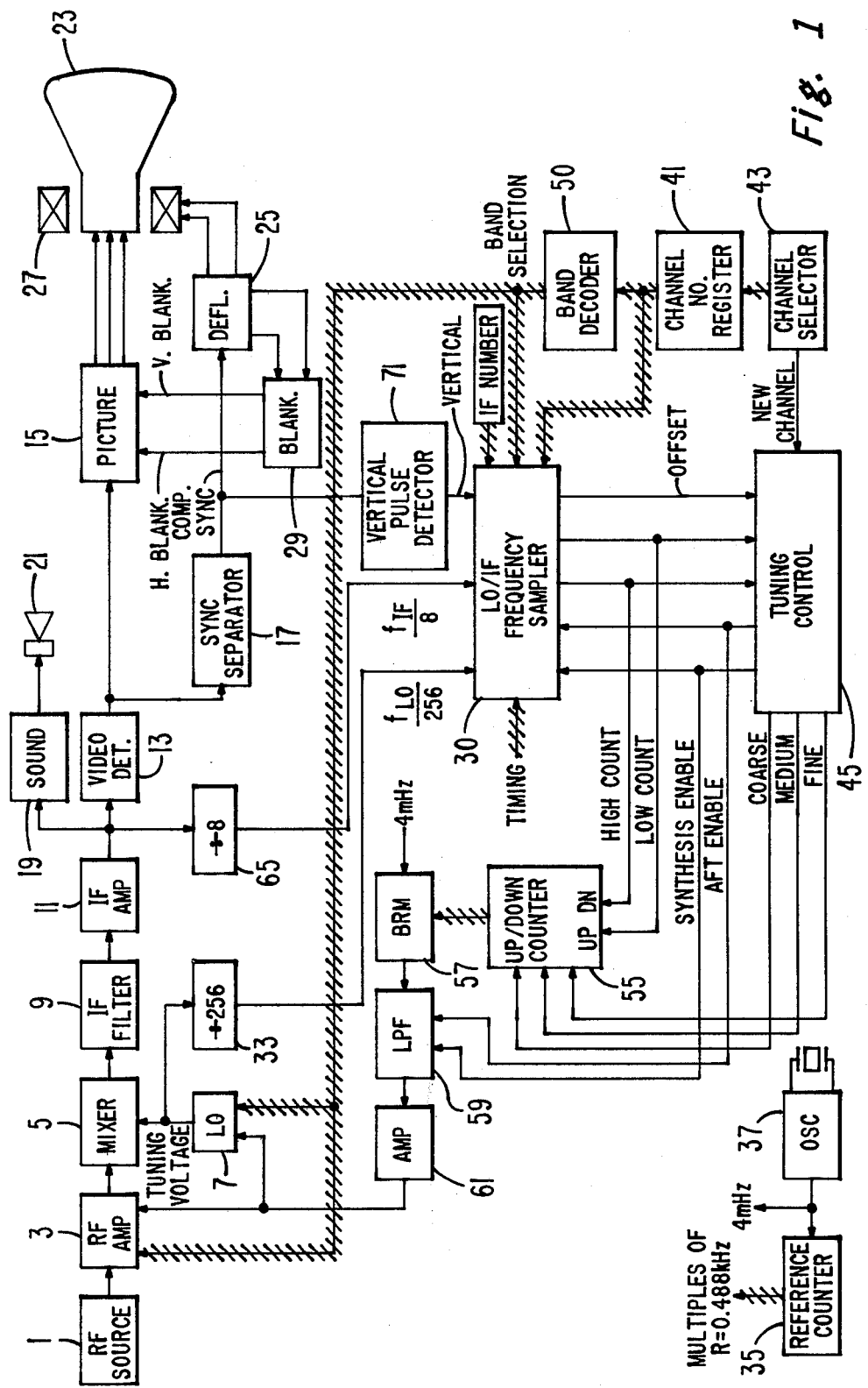
FIG. 1 is a schematic, in block diagram form, of a tuning system in which the present invention may be advantageously employed.

Now referring to FIG. 1, a source of RF signals 1 provides a plurality of RF television signals to a television receiver corresponding to respective channels. Each RF signal includes modulated picture, color and sound carriers. The RF signals supplied by RF source 1 are coupled to an RF amplifier 3 which is tuned in response to a tuning voltage (TV) to select one of the RF signals corresponding to a channel selected by a user. The selected RF signal is coupled to a mixer 5. Mixer 5 also receives a local oscillator signal generated by a local oscillator 7. Local oscillator 7 is also responsive to the tuning voltage to control the frequency of the local oscillator signal in accordance with the selected channel. Mixer 5 heterodynes the RF signal selected by RF amplifier 3 with the local oscillator signal generated by local oscillator 7 to produce an IF signal including modulated picture, color and sound carriers corresponding to those of the selected RF signal. In the United States the picture carrier has a nominal frequency of 45.75 mHz. The color carrier has a nominal frequency of 42.17 mHz. The sound carrier has a nominal frequency of 41.25 mHz.

RF amplifier 3 and local oscillator 7 each include tuned circuits for determining their frequency responses. Each tuned circuit includes an inductor and a voltage controlled capacitance diode, commonly referred to as a "varactor" diode. The varactor diode is reverse biased by the tuning voltage to exhibit a capacitive reactance. The magnitude of the tuning voltage determines the magnitude of the capacitive reactance and therefore the frequency response of the tuned circuit. Since a single varactor controlled tuned circuit configuration is not capable of being tuned throughout the entire television range, different tuned circuit configurations are selectively enabled in response to band-selection control signals generated in accordance with the frequency band of the selected channels.

The IF signal generated by mixer 5 is coupled to an IF filter 9 which filters the received IF signal. The filtered IF signal is amplified by an IF amplifier 11 and coupled to a video detector 13. Video detector 13 demodulates the filtered and amplified IF signal to produce a baseband video signal representing luminance, chrominance and synchronizing information. The baseband video signal is coupled to a picture processing unit 15 and to a synchronization signal (sync) separator 17. The IF signal is also coupled to a sound processing unit 19 which extracts the sound information from the IF signal to produce an audio signal. The audio signal is amplified by sound processing unit 19 and coupled to a speaker 21.

Picture processing unit 15 separates the baseband video signal into signals representing luminance and chrominance information and processes the separated luminance and chrominance signals to produce signals, R, G and B, representing red, green and blue information, respectively. The R, B and G signals are coupled to respective electron guns of a picture tube 23 which in response to these signals generates respective electron beams.

Sync separator 17 extracts a composite picture synchronizing signal (graphically illustrated in FIG. 5) containing horizontal and vertical synchronizing pulses from the baseband video signal. The composite synchronizing signal is coupled to a deflection unit 25 which produces horizontal and vertical deflection signals. The deflection signals are coupled to deflection coils 27 associated with picture tube 23 for deflecting the electron beams produced by the electron guns of picture tube 23 in a conventional raster pattern. Specifically, horizontal and vertical deflection signals cause the electron beam generated by the guns of picture tube 23 to be horizontally scanned in successive scan lines. After each scan line the electron beams are retraced to the beginning of the next lower scan line. At the end of a complete field of scan lines (525 in the United States) the electron beams are retraced to the top of the next field during a vertical retrace interval.

A blanking unit 29 is responsive to the horizontal and vertical deflection signals generated within deflection unit 25 to generate horizontal and vertical blanking pulses during the horizontal and vertical retrace intervals, respectively. The blanking pulses are coupled to picture processing unit 15 to inhibit the generation of an image during the retrace intervals.

The portion of the television receiver shown in FIG. 1 described so far is conventional and therefore need not be described in greater detail. The remaining portion of the television receiver shown in FIG. 1 comprises a tuning control system of the type described in the concurrently filed U.S. patent application referred to above for generating the tuning voltage and band switching signals for RF amplifier 3 and local oscillator 7.

Basically, the tuning control system includes two frequency locked loops (FLLs). When a new channel is selected, the operation of a first FLL is enabled. The first FLL measures the frequency of the local oscillator (LO) signal and generates control signals for controlling the magnitude of the tuning voltage until the frequency of the LO signal is within a predetermined range of the nominal value for the selected channel. When the first FLL has completed its operation, the operation of the second FLL is enabled. The second FLL measures the frequency of the picture carrier of the IF signal and generates control signals for controlling the magnitude of the tuning voltage until the frequency of the picture carrier is within a predetermined range of its nominal value.

The first FLL synthesizes the nominal LO frequency for the selected channel. The nominal LO frequency is that frequency required to tune the broadcast RF signal associated with the respective channel. In the United States, broadcast RF signals are required by the Federal Communication Commission to have very precise standard frequencies. The second FLL makes it possible to automatically fine tune the receiver to RF signals which are offset in frequency with respect to respective broadcast RF signals. Such nonstandard frequency RF carriers may be provided by cable or master antenna television systems, video tape and disk players, video games or home computers which may comprise RF source 1.

The first and second FLLs share a common frequency sampler 30, which selectively measures the frequency of the LO signal during the synthesis mode of operation and measures the frequency of the picture carrier of the IF signal during the automatic fine tuning (AFT) mode of operation. Frequency sampler 30 is selectively enabled to measure the frequency of the LO signal in response to the high logic level of a "synthesis enable" control signal and enabled to measure the frequency of the IF signal in response to the high logic level of an "AFT enable" control signal. The "synthesis enable" and "AFT enable" control signals are generated by a tuning control unit 45 in the manner to be described below.

The LO signal is coupled to a first frequency divider or prescaler 33 which divides the frequency of the LO signal to produce a frequency divided version of the LO signal which is coupled to frequency sampler 30. The IF signal is coupled to a second frequency divider or prescaler 65 which divides the frequency of the IF signal by a second division factor to produce a frequency divided version of the IF signal which is also coupled to frequency sampler 30. Since the dominant carrier in the IF signal is the picture carrier, prescaler 65 will respond to the picture carrier rather than the other carriers in the IF signal. Therefore, the output signal of prescaler 65 is actually a frequency divider version of the picture carrier of the IF signal. The first and second division factors of prescalers 33 and 65 are selected so that the respective frequency divided signals provided to frequency sampler 30 have frequencies within the operating frequency range of frequency sampler 30. Suitable first and second division factors for use in the United States are two hundred and fifty-six and eight as indicated by way of example in FIG. 1. For these division factors, prescaler 33 produces one pulse for every two hundred and fifty-six cycles of the LO signal and prescaler 65 produces one pulse for every eight cycles of the picture carrier of the IF signal.

Since the picture carrier of the received RF signal may be overmodulated, the picture carrier of the IF signal may correspondingly be overmodulated. Accordingly, the amplitude of the picture carrier of the IF signal may be so low that prescaler 65 and therefore frequency sampler 30 may not be able to reliably respond to it. So that a reliable frequency measurement of the picture carrier of the IF signal can be obtained by frequency sampler 30, frequency sampler 30 is selectively enabled to measure the frequency of the IF signal in the AFT mode of operation only during a portion of the vertical retrace interval in which the picture carrier tends not to be overmodulated and therefore has a relatively high amplitude suitable for a reliable frequency measurement. For this purpose, the composite sync signal produced by sync separator 17 is coupled to a "vertical pulse" detector 71. At the beginning of the vertical retrace interval "vertical pulse" detector 71 generates a "vertical" pulse which is coupled to LO frequency sampler 30. The "vertical" pulse initiates the frequency measurement of the picture carrier of the IF signal during a predetermined portion of the vertical retrace interval as illustrated in FIG. 5a.

In FIG. 5a, waveform A illustrates a typical baseband video signal with particular emphasis on the vertical retrace interval. It will be noted that in the picture interval, the amplitude of the video signal between successive horizontal synchronizing pulses (separated by horizontal scanning intervals H) may be quite low in accordance with the modulation of the picture carrier. However, in the vertical retrace interval, the amplitude of the video signal is relatively high. As indicated in waveform B, the "vertical" pulse is generated just after the end of the first vertical sync pulse in the vertical retrace interval. As indicated in waveform E, the LO frequency measurement interval begins shortly after the generation of the "vertical" pulse and ends just before the portion of the vertical retrace interval reserved for teletext and test signal information. This is desirable because the picture carrier may be overmodulated by the teletext and test signal information as indicated by the phantom lines in the teletext and test signal interval of waveform A.

As will be described in greater detail with reference to FIGS. 2 and 3 frequency sampler 30 includes a counter arrangement which is selectively enabled to count pulses of either the frequency divided version of the LO signal or the frequency divided version of the IF signal during respective measurement intervals. The measurement intervals are established by timing signals coupled to frequency sampler 30 from a reference counter 35. Reference counter 35 produces the timing signals by successively dividing the frequency of a reference frequency signal generated by a crystal controlled oscillator 37. By way of example, as is indicated in FIG. 1, crystal controlled oscillator 37 is arranged to produce a reference frequency signal 4 mHz. The lowest frequency timing signal produced by reference counter 35 has a frequency of 488.2 Hz (4 mHz÷$2^{13}$) or a period of 2048 microseconds and is referred to as R. Other timing signals utilized in the structures shown in the FIGURES are indicated as 2R, 4R, 64R and 256R, where the coefficient of R indicates the inverse relationship of the period of the particular timing signal to that of R. E.g., 2R has a period of 1024 microseconds, 4R has a period of 512 microseconds, 64R has a period of 32 microseconds and 256R has a period of 8 microseconds.

Just prior to the measurement intervals, the counter arrangement is preset to respective predetermined conditions corresponding to numbers related to the nominal frequencies of the signals to be measured. While the nominal frequency of the picture carrier of the IF is the same for each channel, the nominal frequency of the LO signal is different for each channel. Accordingly, binary signals representing the channel number and frequency band of the selected channel are coupled to frequency sampler 30 from a channel number register 41 and band decoder 50, respectively, in order to determine the condition to which counter arrangement is preset just prior to the LO frequency measurement interval.

During the measurement intervals, the contents of the counter arrangement are decreased in response to the pulses of the frequency divided version of the signal being measured. Just after the end of the measurement interval, the contents of the counter arrangement are examined to determine the frequency error, if any, of the signal being measured. If the counter reaches a count of zero during the measurement interval, the counter will "wrap-around" so that a high count will be produced at the end of the measurement interval. If the frequency of the signal measured is low, the count will be low and a corresponding "low count" error pulse will be produced. If the frequency of the signal measured is high, the count will be high and a "high count" error pulse will be produced.

The "high count" and "low count" error pulses are coupled to down and up control inputs of an up/down counter 55. In response to "high count" error pulses the contents of up/down counter 55 will be decreased. In response to "low count" error pulses, the contents of up/down counter 55 will be increased. The contents of counter 55 are coupled to binary rate multiplier (BRM) 57. BRM 57 also receives the 4 mHz reference frequency signal from crystal oscillator 37. BRM 57 produces a pulse signal having a number of pulses, in a given interval, which depends on the contents of up/down counter 55. The pulse signal produced by BRM 57 is coupled to a low pass filter (LPF) 59 which filters received pulse signals to produce a DC signal. The DC signal is coupled to an amplifier 61 which amplifies the DC signal to produce the tuning voltage.

The channels are selected by means of a channel selector 43 which, e.g., may comprise a calculator-like keyboard by which the two-digit number corresponding to the selected channel can be entered into channel number register 41. The binary signals representing the channel number of the selected number stored in channel number register 41 are coupled to band decoder 50 as well as to frequency sampler 30. Band decoder 50 generates binary signals representing the band of the selected channel which are coupled to RF amplifier 3 and to local oscillator 7 as well as to frequency sampler 30. By way of example, for receivers to be used in the United States, band decoder 50 generates a high logic level signal $V_{LL}$ for VHF channels 2, 3 and 4, a high logic level signal $V_{LH}$ for VHF channels 5 and 6, a high logic level signal $V_H$ for VHF channels 7 through 13 and a high logic level signal U for UHF channels 14 through 83.

Whenever a new channel is selected, channel selector 43 generates a "high level" new channel signal which is coupled to control unit 45. In response control unit 45 causes the "synthesis enable" signal to have the high logic level. This causes frequency sampler 30 to measure the frequency of the LO signal. In response to the resulting "high count" and "low count" error pulses produced by frequency sampler 30, the contents of up/down counter 55 and thereby the magnitude of the tuning voltage are adjusted until the frequency of the LO signal is within a predetermined range of its nominal frequency. At that point, tuning control unit 45 causes the "synthesis enable" signal to have the low logic level and causes the "AFT enable" signal to have the high logic level. This causes frequency sampler 30 to be enabled to measure the frequency of the IF signal. However, the frequency of the IF signal is not actually measured until the "vertical" pulse is generated by vertical pulse detector 71 during the vertical retrace interval. The "high count" and "low count" error pulses produced in accordance with the frequency measurement of the IF signal are coupled to up/down counter 55 to determine its contents and thereby the magnitude of the tuning voltage to control the frequency of the LO signal until the frequency of the picture carrier is within a predetermined range of its nominal value.

During the AFT mode of operation, when the AFT signal has the high logic level, except when caused to measure the frequency of the picture carrier of the IF signal during the vertical retrace interval, frequency sampler 30 measures the frequency of the LO signal. This is done in order to determine if the frequency of the LO signal has been caused to change from the value established during the previous synthesis mode of operation by a predetermined offset, e.g., ±1.25 mHz. If the predetermined offset of the frequency of the LO signal is detected, frequency sampler 30 generates an "offset" pulse which is coupled to tuning control unit 45. In response tuning control unit 45 ends the high logic level of the "AFT enable" control signal and again generates the high logic level "synthesis enable" control signal. This again initiates the synthesis mode of operation.

To rapidly synthesize the nominal LO frequency for the selected channel, as will be described below in greater detail with reference to FIG. 8 which shows a logic implementation of up/down counter 55, BRM 57 and LPF 59 during the synthesis mode of operation, successively lower order groups of stages of up/down counter 55 are enabled to respond to the "high count" and "low count" error pulses in response to respective "coarse tune", "medium tune" and "fine tune" control signals generated by tuning control unit 45. Tuning control unit 45 generates the latter control signal in sequence by sensing whenever the sense of the error pulses generated by frequency sampler 30 changes during the synthesis mode of operation changes.

It will also be noted that the "synthesis enable" and "AFT enable" control signals are coupled to LPF 59 from tuning control unit 45. The purpose of this is to change the time constant of low pass filter 59 for the different modes of operation. Specifically, for the synthesis mode of operation where the removal of pulse components from the DC signal applied to amplifier 61 is not critical, the bandwidth of LPF 59 is made relatively large in response to the high logic level of the "synthesis enable" signal. However, for the AFT mode of operation, in which the final tuning voltage is generated and in which pulse components appearing in the tuning voltage could produce visible interference in the reproduced image, the bandwidth of LPF 59 is caused to be relatively small in response to the high level of the "AFT enable" signal.

Figure 2:
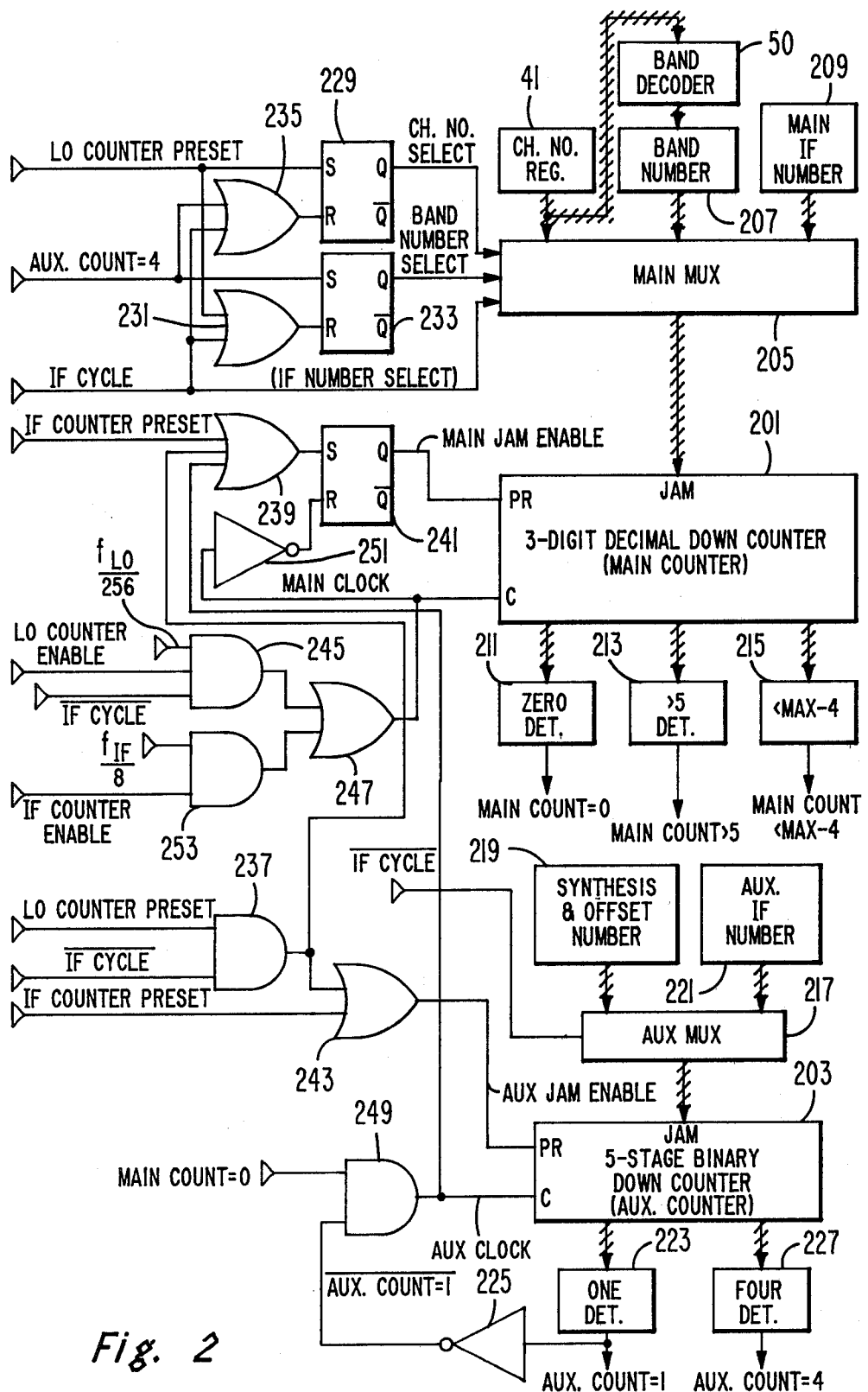
FIGS. 2, 3, 4, 5 and 6 are schematics, in logic diagram form, of respective portions of a preferred embodiment of the present invention.

Turning now to the implementation of a portion of frequency sampler 30 shown in FIG. 2, the counter arrangement referred to above includes a main down counter 201 and an auxiliary down counter 203.

A main multiplexer (MUX) or switch selectively couples either BCD (binary coded decimal) signals representing the channel number of the selected channel, BCD signals representing the band of the selected channel (e.g., 89 for low VHF channels 2-4, 93 for low VHF channels 5-6, 179 for high VHF channels 7-13 and 433 for UHF channels 14-83 in the United States) or BCD signals representing a number related to the number of cycles of the frequency divided version of the picture carrier of the IF signal which occur in the frequency measurement interval for the IF signal (e.g., 366 in the United States) to the "jam" inputs of main down counter 201 in response to the respective one of a high logic level "channel number select" signal, a high logic level "band select" signal and a high logic level "IF number select" signal. Since the highest number represented by the BCD signals coupled to the "jam" inputs of main down counter 201 is a three digit number, as indicated in FIG. 2, main counter 201 is a three-digit decimal down counter. As earlier indicated with respect to FIG. 1, the BCD signals representing the channel number are stored in channel register 41. The BCD signals representing the band related number are generated by a logic array indicated as 207 in response to the band-selection signals produced by band decoder 50. The BCD signals representing the IF picture carrier frequency related number, indicated as the "main IF number", are provided by a logic array indicated as 209.

A "zero count" detector generates a high logic level "main count=0" signal when the count contained in main down counter 201 is equal to zero. A ">5" detector 213 generates a high logic level "main count>5" signal when the count contained in main down counter 201 is greater than five. A "<max−4" detector 215 generates a high logic level "main count<max−4" signal when the count contained in main down counter 201 is less than the maximum count minus four.

Figure 7A:
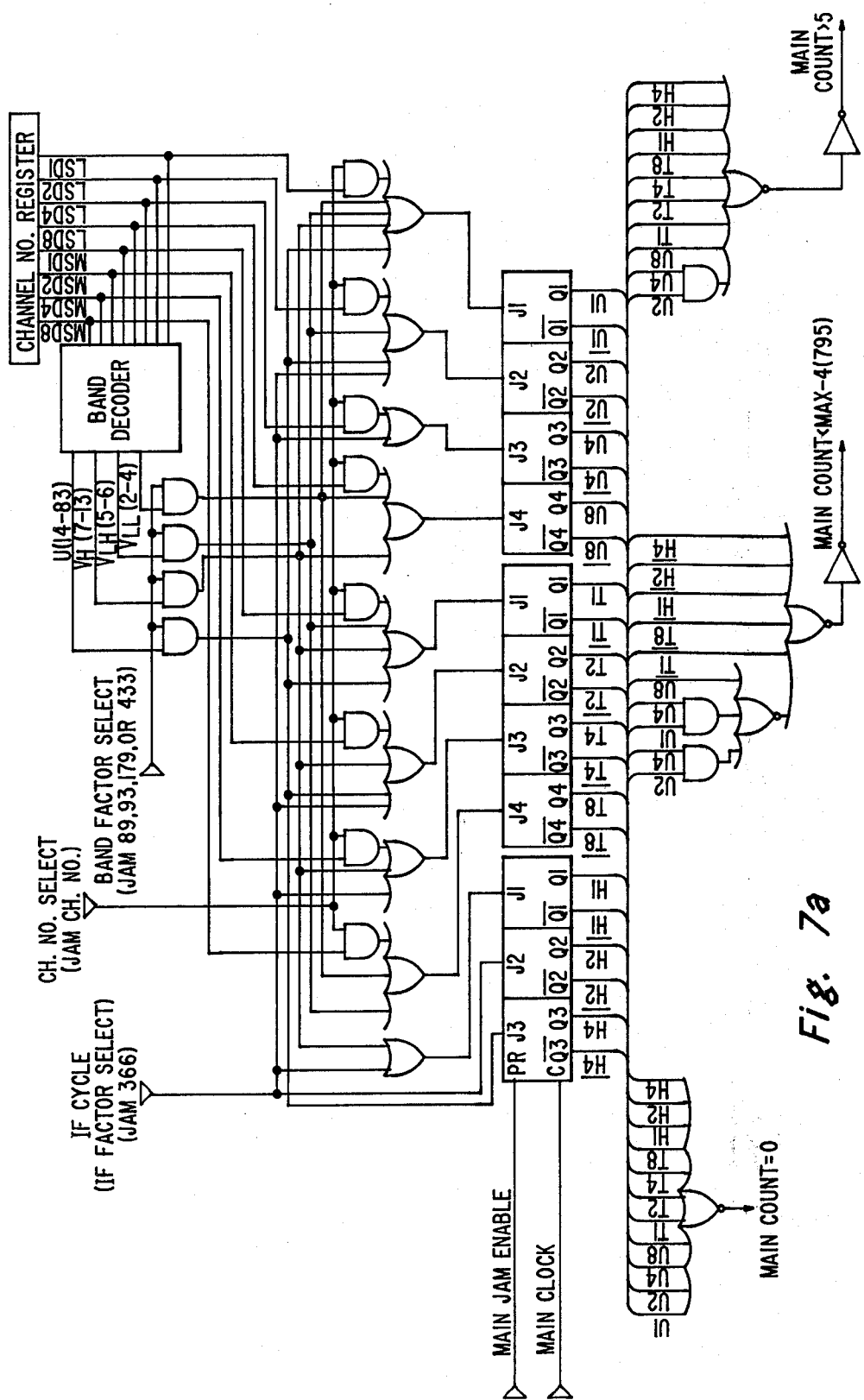
FIGS. 7a and 7b are schematics in logic diagram form of specific implementations of portions of the structures shown in FIG. 2 in block form.

A logic implementation of main counter 201, main multiplexer 205, logic arrays 207 and 209 and detectors 211, 213 and 215 is shown in FIG. 7a.

An auxiliary multiplexer (AUX MUX) 217 selectively couples binary signals representing, in straight binary code, a first number, identified as the "synthesis and offset" number (e.g., 28), used in connection with the measurement of the LO frequency in the synthesis mode of operation for the generation of error pulses and also in the AFT mode of operation for the LO frequency offset detection, or binary signals representing, also in straight binary code, a second number, identified as the "auxiliary IF number" (e.g., 4), used in connection with the measurement of the IF picture carrier frequency in the AFT mode of operation, to the "jam" inputs of auxiliary down counter 203 in response to a control signal indicated as "IF cycle". The control signal "IF cycle" has the high logic level except during a portion of the vertical retrace interval (see waveform G of FIG. 5a) in which the IF frequency is measured, at which time the "IF cycle" control signal has the low logic level. When the "IF cycle" control signal has the high logic level, AUX MUX 217 couples the binary signals representing the "synthesis and offset" number to the "jam" inputs of auxiliary down counter 203. When the "IF cycle" control signal has the low logic level, AUX MUX 217 couples the binary signals representing the "auxiliary IF number" to the "jam" inputs of auxiliary down counter 203. The binary signals representing the "synthesis and offset" number are provided by a logic array 219. The binary signals representing the "auxiliary IF number" are provided by a logic array 221. Since the highest number represented by the binary signals coupled to auxiliary down counter 203 in the embodiment shown in FIG. 2 is 28, auxiliary counter 203 is a five stage down counter as indicated.

A "one" detector 223 generates a high logic level "auxiliary count=1" signal when the count contained in auxiliary counter 203 equals 1. An inverter 225 inverts the "auxiliary count=1" signal to produce an "auxiliary count=1" signal. A "four" detector 227 generates a high logic level "auxiliary count=4" signal when the count contained in auxiliary counter 203 equals four.

Figure 7B:
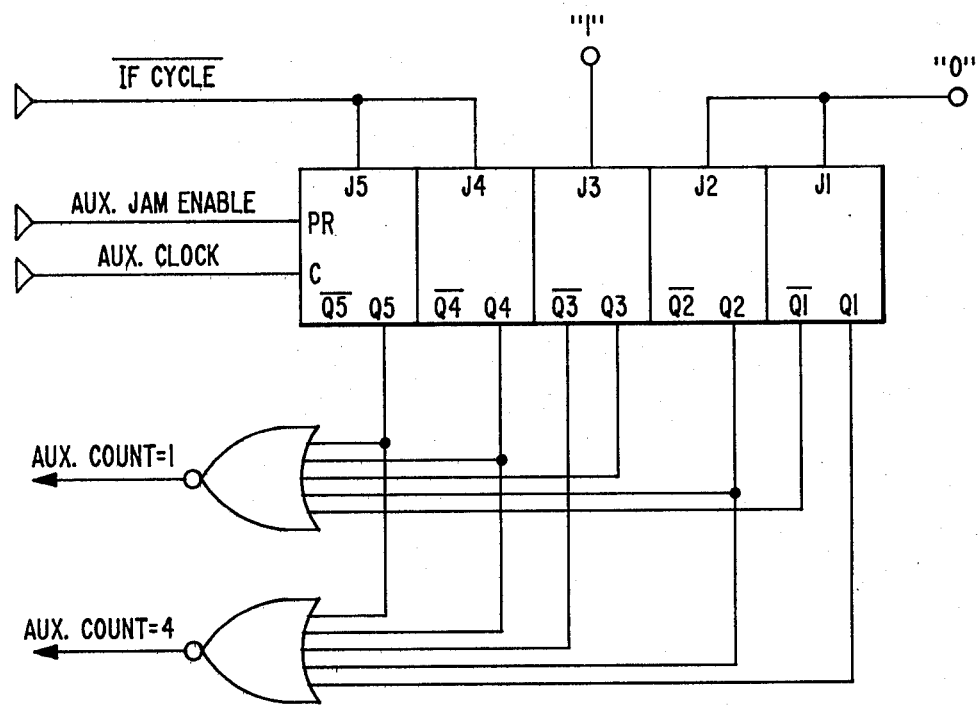

A logic implementation of auxiliary counter 203, AUX MUX 217, logic arrays 219 and 221 and detectors 223 and 227 is shown in FIG. 7b.

Figure 3:
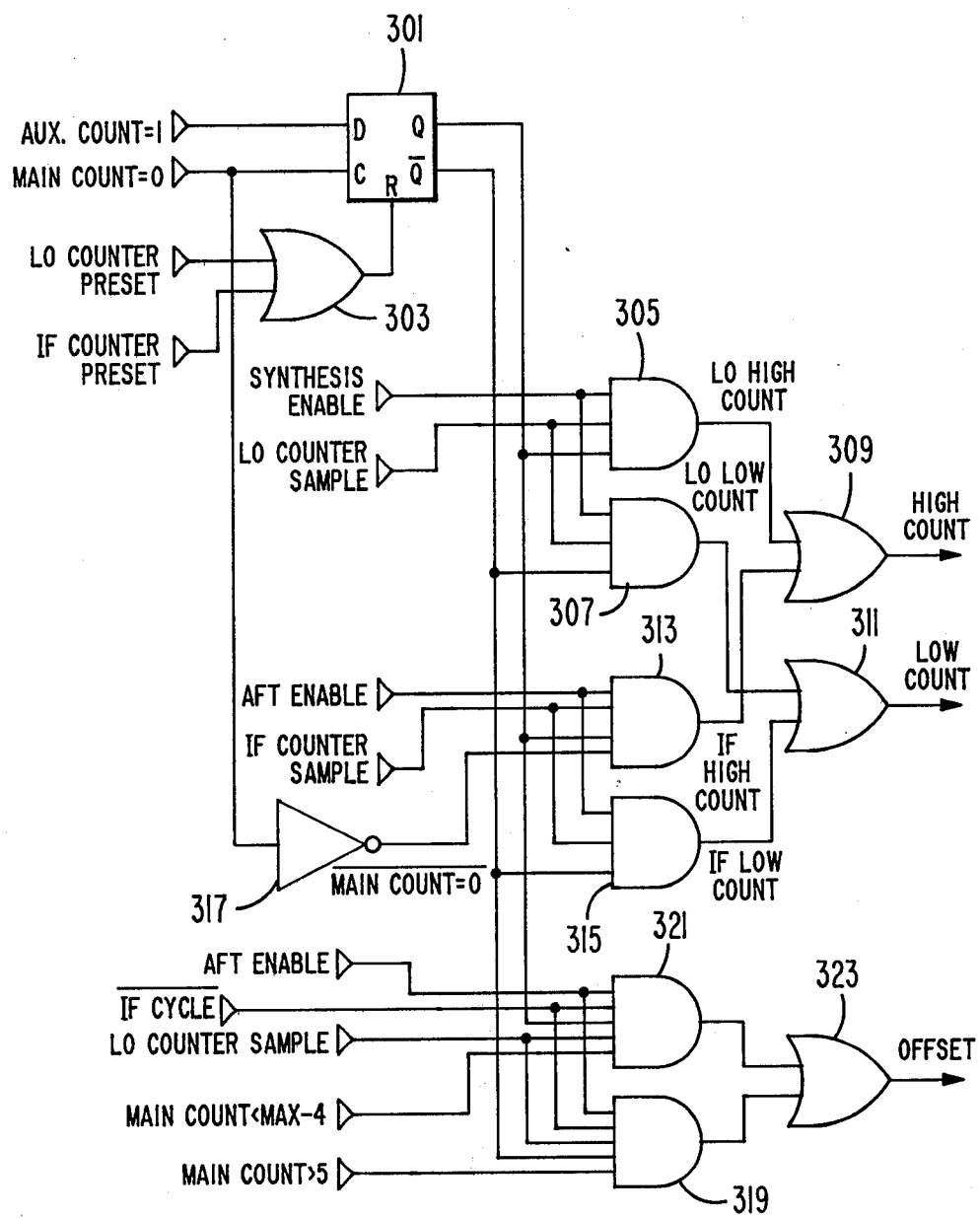

Before describing the remaining structure shown in FIG. 2 and the structure shown in FIG. 3, a general functional description of their operations will be helpful.

As earlier noted, in each frequency measurement operation, the counter arrangement of frequency sampler 30 is in essence enabled to count down from a predetermined number in response to pulses of the frequency divided version of signal being measured during a measurement interval. The predetermined number is loaded into the counter arrangement just prior to the measurement interval. After the end of the measurement interval, the count in the counter arrangement is examined in order to determine the frequency error, if any.

Specifically, with reference to the structure shown in FIG. 2, the predetermined number is established by loading the binary signals then supplied to the "jam" inputs of main down counter 201 from main MUX 205 into main down counter 201 and by loading the binary signals then supplied to the "jam" inputs of auxiliary down counter 203 from AUX MUX 217 into auxiliary down counter 203 in response to positive-going "jam enable" signals coupled to respective preset (PR) inputs of counters 201 and 203. The binary signals supplied to the "jam" inputs of counters 201 and 203 at that point are dependent on whether the frequency of the LO signal or the frequency of the IF signal is to be measured. Thereafter, in response to the high logic level of a "counter enable" signal the frequency divided version of the signal to be measured is coupled through a gating arrangement to the clock (C) input of the main down counter 201. As long as the "count enable" signal has the high logic level, the count of main down counter 201 is reduced by one in response to each pulse of the frequency divided version of the signal being measured. The duration of the high logic level of the "count enable" signal is dependent on the signal being measured. Each time the count of counter 201 is equal to zero, until the count in auxiliary down counter 203 reaches one, the count in auxiliary counter 203 is reduced by one and a "jam enable" signal for main counter is generated. The latter causes the binary signals then supplied to the "jam" inputs of main counter 201. The binary signals supplied to the "jam" inputs of main counter 201 by main MUX 205 at that point are dependent on whether the frequency of the LO signal is being measured or the frequency of the IF signal is being measured and when the frequency of the LO signal is being measured on the specific count of auxiliary counter 203. At the end of the measurement interval, when the high logic level of the "counter enable" pulse ends, the frequency divided version of the signal being measured is decoupled from the clock input of main counter 201. Thereafter, in response to a "sample pulse," the contents of main counter 201 are examined by the structure shown in FIG. 3. Depending on the contents of main counter 201 and whether the frequency of the LO signal or the frequency of the IF signal is being measured, the structure of FIG. 3 may produce either a "high count" or "low count" error pulse or an "offset" pulse.

When the frequency of the LO signal is at its nominal value for the selected channel, with an LO prescaler division factor, e.g., of 256, as indicated with respect to FIG. 1, the number of cycles of the frequency divided version of the LO signal which occurs in a measurement interval having a duration, e.g., of 1024 microseconds, is equal to four times the frequency, in mHz, of the nominal LO frequency.

According to an aspect of the present invention, the counter arrangement shown in FIG. 2, comprising main counter 201 and auxiliary counter 203, takes advantage of the fact that the channels in each band of the television range are uniformly separated in frequency band to measure the frequency of the LO signal by enabling the counter arrangement to count down from a preset number equal to four times the nominal LO frequency in mHz, without the need for a relatively large ROM for storing the LO frequency for each channel. More specifically, the LO frequency, $f_{LO}$, for each channel can be expressed by the following equation:

$$f_{LO} = (\text{channel number})(\text{frequency separation}) + \text{a band dependent constant} \quad (1)$$

Accordingly, with a LO prescaler division factor of 256 and a measurement interval of 1024 microseconds by way of example, the preset number of each channel can be expressed by the following equation:

$$\text{preset number} = (4)[(\text{channel no.})(\text{frequency separation}) + \text{a band dependent constant}] \quad (2)$$

By way of example the nominal values frequency of the LO signal for the broadcast channels in the United States according to equation (2) are indicated in the following table.

| BAND | CHANNEL NO. | BAND CONSTANT | $f_{LO}$(in mHz) |
|---|---|---|---|
| VHF$_{LL}$ | 2 | 89 | 101 = (2)(6) + 89 |
| | . | . | . |
| | . | . | . |
| | . | . | . |
| | 4 | 89 | 113 = (4)(6) + 89 |
| VHF$_{LH}$ | 5 | 93 | 123 = (5)(6) + 93 |
| | 6 | 93 | 129 = (6)(6) + 93 |
| VHF$_H$ | 7 | 179 | 221 = (7)(6) + 179 |
| | . | . | . |
| | . | . | . |
| | . | . | . |
| | 13 | 179 | 257 = (13)(6) + 179 |
| UHF | 14 | 433 | 517 = (14)(6) + 433 |
| | . | . | . |
| | . | . | . |
| | . | . | . |
| | 83 | 433 | 931 = (83)(6) + 433 |

With the values indicated in the above table, equation (2) becomes:

$$\text{preset number} = (24)(\text{channel number}) + (4)(\text{band constant}) \quad (3)$$

With equation (3) in mind, the operation of the structure of FIG. 2 to measure the frequency of the LO signal will be explained. Just prior to the LO frequency measurement interval, the binary signals representing the channel number, provided by channel number register 41, are loaded into main down counter 201 and binary signals representing 28 (i.e., 24 +4), provided by logic array 219, are loaded into auxiliary down counter 203. During the LO frequency measurement interval, the frequency divider version of the LO signal is coupled to the clock input of main down counter 201. In response to each pulse of the frequency divided version of the LO signal, the count in main down counter 201 is reduced by one. During the measurement interval, until the count in auxiliary counter 203 reaches one, whenever the count in main down counter 201 reaches zero, the count in auxiliary counter 203 is reduced. In addition, until the count in auxiliary counter 203 reaches four, whenever the count in main down counter 201 reaches zero, the binary signals representing the channel number are again loaded into main down counter 201. When the count in auxiliary down counter reaches four, the binary signals representing the band dependent constant, provided by logic array 207, are loaded into main down counter 201. Thereafter, the count of auxiliary down counter 203 continues to be reduced by one each time the count of main down counter 201 reaches zero until the count of auxiliary counter 203 reaches one. If the LO frequency is at its nominal value, when the measurement interval ends, the count of main down counter 201 will just have reached zero during the interval in which the count of auxiliary counter 203 is one in accordance with equation (3) above.

Depending on the actual LO frequency, at the end of the measurement interval, the structure shown in FIG. 3 generates a "low count" or "high count" error pulse during the synthesis mode of operation and an "offset" pulse during the AFT mode of operation.

Main down counter 201 and auxiliary down counter 203 are also used to measure the frequency of the picture carrier of the IF signal. When the frequency of picture carrier is at its nominal value, 45.75 mHz in the United States, with an IF prescaler division factor of eight, as indicated by way of example with respect to FIG. 1, the number of cycles of the frequency divided version of the IF signal which will occur in a measurement interval of, e.g., 256 microseconds, is 1464 or (4)(366).

Keeping the count of 1464 which corresponds to the nominal frequency of the IF picture carrier in mind, the operation of the structure of FIG. 2 to measure the frequency of the IF picture carrier will now be described. Just prior to the IF frequency measurement interval, binary signals, produced by logic array 209, representing the number 366 are loaded into main down counter 201 and binary signals, produced by logic array 221, representing the number four are loaded into auxiliary down counter 203. During the IF frequency measurement interval, in response to each pulse of the frequency divided version of the IF signal, the count of main down counter 201 is reduced by one. Until the count in auxiliary down counter 203 reaches one, whenever the count in main down counter 201 reaches zero, the count of auxiliary down counter 203 is reduced by one and the binary signals, produced by logic array 209, representing the number 366 are again loaded into main down counter 201. During the interval in which the count of auxiliary down counter 203 is one, if the frequency of the picture carrier of the IF signal is at its nominal value, the count of main down counter 201 will just reach zero when the IF frequency measurement interval ends. Depending on the actual frequency of the IF picture carrier, at the end of the IF frequency measurement interval, the structure shown in FIG. 3 generates a "high count" or "low count" error pulse.

The structure shown in FIG. 4, to be described below, generates "LO counter preset", "LO counter enable" and "LO counter sample" pulse signals, graphically illustrated in FIG. 4a, for controlling counters 201 and 203 to measure the frequency of the LO signal. The "LO counter preset" pulses cause counters 201 and 203 to be loaded with the appropriate binary signals just prior to the LO frequency measurement intervals. The high logic level of the "LO counter enable" pulses enable the frequency divided version of the LO signal to be coupled to the clock (C) input of main down counter 201 and thereby determines the duration of the LO frequency measurement intervals. The "LO counter sample" pulses occur just after the end of the LO frequency measurement intervals and cause the structure of FIG. 3 to evaluate the count in main down counter 201 in order to generate the error pulses. The LO counter "preset", "enable" and "sample" pulses are continuously generated by the structure of FIG. 4 in response to the 4R, 2R and R timing signals generated by reference counter 35 shown in FIG. 1.

The structure shown in FIG. 5, to be described below, generates IF counter "preset", "enable" and "sample" pulses graphically illustrated in FIG. 5a, which have similar functions to corresponding ones of the LO counter pulses to control counters 201 and 203 to measure the frequency of the IF picture carrier. In addition, the structure of FIG. 5 also generates "IF cycle" pulses (waveform G) also graphically illustrated in FIG. 5a, which encompass the IF counter "preset", "enable" and "sample" pulses. The IF counter pulses are generated in response to the 64R timing signal also generated by reference counter 35. Unlike the LO counter pulses, the IF counter pulses are not continuously generated but are rather selectively enabled to be generated, in response to "vertical" pulses (waveform B), only during a portion of the vertical retrace interval, e.g., starting after the first vertical sync pulse and ending just before the teletext and test signal interval (see waveforms A and G). The latter ensures that any overmodulation of the IF picture carrier does not adversely affect the ability of main down counter 201 to count the pulses of the frequency divided version of the IF signal. The "IF cycle" pulse (waveform G) is utilized to disable the structures of FIGS. 2 and 3 from responding to the LO counter pulses during the IF frequency measurement operation.

Now specifically referring to the structure shown in FIG. 2, the "LO counter preset" signal is coupled to the set (S) input of a set-reset flip-flop (S-R FF) 229 and to one input of an OR gate 231. The output of OR gate 231 is coupled to the reset (R) input of a S-R FF 233. The "channel number select" signal is generated at the Q output of S-R FF 229 and the "band number select" signal is generated at the Q output of S-R FF 231. The "aux. count=4" signal, generated by detector 227, is coupled to one input of an OR gate 235. The output of OR gate 235 is coupled to the reset (R) input of S-R FF 231. The "IF cycle" signal is coupled to the second input of OR gates 231 and 235.

The "IF cycle" signal has the low logic level except during the frequency measurement operation of the IF cycle in which it has the high logic level. The high logic level of the "IF cycle" signal is coupled to the reset (R) inputs of S-R FFs 229 and 233, through OR gates 231 and 235, respectively, and keeps them reset and therefore unable to respond to the high logic levels of the "LO counter preset" and "aux. count=4" signals.

Assuming for the moment that the "IF cycle" signal has the low logic level, when the "LO counter preset" pulse occurs, i.e., the "LO counter preset" signal has the high logic level, S-R FF 229 is set and S-R FF 233 is reset. As a result, the "channel number select" signal has the high logic level and the "band number select" signal has the low logic level. Accordingly, in response to the "LO counter preset" pulse, main MUX 205 is caused to couple the binary signals representing the channel number of the selected channel stored in channel number register 41 to the "jam" inputs of main down counter 201.

As earlier noted, the "$\overline{\text{IF cycle}}$" signal, i.e., the complement of the "IF cycle" signal, is coupled to the control input of AUX MUX 217. Assuming the "IF cycle" signal to have the low logic level, the "$\overline{\text{IF cycle}}$" signal has the high logic level. This causes the binary signals representing the "synthesis and offset number", e.g., 28, provided by logic array 219, to couple the "jam" inputs of auxiliary down counter 203.

The "LO counter preset" signal and the "$\overline{\text{IF cycle}}$" signal are coupled to respective inputs of an "AND" gate 237. The output of "AND" gate 237 is coupled to one input of an OR gate 239. The output of OR gate 239 is coupled to the (S) set input of a S-R FF 241 and to one input of an OR gate 243. The Q output of S-R FF 241 is coupled to the preset (PR) input of main down counter 201. The output of OR gate 243 is coupled to the preset (PR) input of auxiliary down counter 203. Accordingly, still assuming that the "$\overline{\text{IF cycle}}$" signal has the high logic level when the "LO counter preset" pulse occurs, the binary signals representing the channel number to be loaded into main down counter 201 and the binary signals representing the "synthesis and offset" number, e.g., 28, are loaded into auxiliary down counter 203.

The frequency divided version of the LO signal ($f_{LO}/256$), the "LO counter enable" signal and the "$\overline{\text{IF cycle}}$" signal are coupled to respective inputs of an AND gate 245. The output of AND gate 245 is coupled to one input of an OR gate 247. The output of OR gate 247 is coupled to the clock (C) input of main down counter 201. Accordingly, again assuming the "$\overline{\text{IF cycle}}$" signal has the low logic level, when the "IF counter enable signal" has the high logic level, the frequency divided version of the LO signal is coupled to the clock (C) input of main down counter 201. Thereafter, the count of main down counter 201 is reduced by one in response to each pulse of the frequency divided version of the LO signal.

The output of "zero" detector 211, associated with main down counter 201, and the output of inverter 225, which inverts the output signal of "one" detector 223 associated with auxiliary down counter 203, are coupled to respective inputs of an AND gate 249. The output of AND gate 249 is coupled to the clock input of auxiliary down counter 203 and a second input of OR gate 239. AND gate 249 is enabled to pass the high level of the "main count=0" signal produced at the output of detector 211 as long as the "aux. count=1" produced at the output of inverter 225 has the high logic level. As earlier noted, when the high logic level is produced at the output of OR gate 239, S-R FF 241 is set causing a high logic level "jam enable" signal to be generated at the preset (PR) input of main down counter 201. Accordingly, each time the count of main down counter 201 equals zero, as long as the count of auxiliary down counter 203 has not reached one, the count of auxiliary counter 203 is reduced by one and the binary signals coupled to the "jam" inputs of main down counter 201 from main MUX 205 are loaded into main down counter 201.

It will be noted that the output of OR gate 247 is also coupled to the input of an inverter 251. The output of inverter 251 is coupled to the reset (R) input of S-R FF 241. As a result, S-R FF 241 will be reset approximately one-half of a cycle of the frequency divided signal coupled to the clock (C) input of main down counter 201 after it is set, e.g., in response to the high logic level "main count=0" signal when the count of main down counter 201 reaches zero. This ensures that the "jam enable" signal for main down counter 201 will last long enough for the binary signals coupled to the "jam" inputs of main down counter 201 to be loaded into it but end before the next pulse of the frequency divided version coupled to the clock (C) input of main down counter 201 occurs. This is important since, during the measurement of the frequency of the LO signal main down counter 201 must be preset between pulses of the frequency divided version of the LO signal to the channel number each time the count of auxiliary down counter 203 reaches zero and the band number when the count of auxiliary counter 203 reaches four. The manner in which the latter occurs will now be described with reference to the specific structure shown in FIG. 2.

The "aux. count=4" signal is coupled from the output of "four" detector 227 to the set (S) input of S-R FF 233 and to an input of OR gate 235. When the count of auxiliary counter 203 reaches four, the high logic level produced at the output of detector 227 is coupled to the set (S) input of S-R FF 233 and, through OR gate 235, to the reset (R) input of S-R FF 229. This causes S-R FF 233 to be set. As a result, again assuming the "IF cycle" signal has the low logic level, only the "band number select" control signal of main MUX 205 will have the high logic level. This causes main MUX 205 to couple the binary signals representing band number, provided by logic array 207, to the "jam" inputs of main down counter 201. Since the "jam enable" signal for main down counter 201 produced at the Q output of S-R FF 241 was set to the high logic level when the count of main down counter 201 reached the new count which caused the count of auxiliary counter 203 to become four, the binary signals representing the band number will be loaded into main down counter 201. Thereafter, the count of main down counter 201 is reduced by one in response to each pulse of the frequency divided version of the LO signal.

Until the count of auxiliary down counter 203 reaches one, each time the count of main down counter 201 reaches zero, the count of auxiliary down counter 203 is reduced by one and the binary signals representing the band number are again loaded into main down counter 201 in response to the high logic level of the "main count=0" signal coupled to the clock (C) input of auxiliary counter 203 and to an input of OR gate 239 through enabled AND gate 249. When the count of auxiliary down counter 203 reaches one, AND gate 249 is disabled from coupling the high logic level of the "main count=0" signal to the clock (C) input of auxiliary down counter 203 and to OR gate 239.

When the high logic level of the "LO counter enable" signal ends, the frequency divided version of the LO signal is decoupled from the clock (C) input of main down counter 201. When the "LO counter sample" pulse occurs just after the high logic level of the "LO counter enable" signal ends, the structure of FIG. 3 examines the count of main counter 201 and depending on whether the "synthesis enable" control signal or the "AFT enable" control signal has the high logic level and on the count of main down counter 201, the structure of FIG. 3 will generate the appropriate error pulse or selective generate or not generate an "offset" pulse, as will be described below with reference to FIG. 3.

Now turning to the IF frequency measurement operation, the "IF cycle" signal is coupled to the main MUX 205 as the "IF number select" control signal. When the high logic level fo the "IF cycle" signal occurs, S-R FFs 229 and 233 are reset, causing the "channel number select" and "band number select" control signals for main MUX 205 to have low logic level and the "IF number select" for main MUX 205 to have the high logic level. Accordingly, main MUX 205 couples the main IF number, e.g., 366, provided by logic array 209 to the "jam" inputs of main down counter 205. When the "IF cycle" signal has the high logic level, the "$\overline{\text{IF cycle}}$" signal has the low logic level. Accordingly, AUX MUX 217 couples the binary signals representing the auxiliary IF number, e.g., four, to the "jam" inputs of auxiliary down counter 203.

When the high logic level "IF counter preset" pulse occurs, it is coupled through OR gate 239 to the preset (PR) input of main down counter 201 and through OR gate 243 to the preset (PR) input of auxiliary down counter 203. Accordingly, the binary signals representing the main and auxiliary IF numbers are loaded into counters 201 and 203, respectively.

The "IF counter enable" signal and the frequency divided version of the IF signal ($f_{IF}/8$) are coupled to respective inputs of an AND gate 253. The output of AND gate 253 is coupled to a second input of OR gate 247. When the high logic level of the "IF counter enable" signal occurs, the frequency divided version of the IF signal is coupled through AND gate 253 and OR gate 247 to the clock (C) input of main down counter 201. In response to each pulse of the frequency divided version of the IF signal, the count of main down counter 201 is reduced by one. Whenever the count of main counter 201 reaches zero, until the count of auxiliary counter 203 reaches one, the high logic level "main count=0" signal is coupled through AND gate 249 to the clock (C) input of auxiliary down counter 203 and through AND gate 249 and OR gate 239 to the set (S) input of S-R FF 241. This causes the count of auxiliary down counter 203 to be reduced by one and the binary signals representing the band number to be loaded into main counter 201. When the high logic level of the "IF counter enable" signal ends, AND gate 253 is caused to decouple the frequency divided local oscillator signal from the clock (C) input of main down counter 201. When the "IF counter sample" pulse occurs just after the end of the high logic level of the "IF counter enable" signal, the structure of FIG. 3 evaluates the count of main counter 201 to generate the appropriate one or neither error pulse.

The structure of FIG. 3 will now be described. If main counter 201 traverses a count of zero during the interval in which the count of auxiliary counter 203 is one, the frequency of the signal being measured is high and if it does not, the frequency is low. Accordingly, structure of FIG. 3 includes a data flip-flop (D FF) 301 for determining whether or not the count of main counter 201 reached a count of zero when the count of auxiliary counter 203 was one during the measurement interval.

D FF 301 is reset in response to the high logic levels of the "LO counter preset" and "IF counter preset" pulses, which are coupled to its reset (R) input through an OR gate 303, just prior to the respective measurement interval. D FF 301 receives the "aux. count=1" signal at its date (D) input and the "main count=0" signal at its clock (C) input. If main counter 201 does not reach a count of zero when the count of auxiliary counter 203 is one, D FF will remain reset and therefore the signal developed at its Q output will have the low logic level and the signal developed at its $\overline{Q}$ output will have the high logic level at the end of the measurement interval. If main counter 201 reaches count of zero when the count of auxiliary counter 203 is one D FF 301 will be set and therefore the signal developed at its Q output will have the high logic level and the signal developed at its $\overline{Q}$ output will have the low logic level at the end of the measurement interval.

AND gates 305 and 307 are used to generate a "LO high count" pulse or a "LO low count" pulse if the frequency of the LO signal is high or low, respectively, during the synthesis mode of operation. To this end, the "synthesis enable" and "LO counter sample" signals are coupled to respective inputs of AND gates 305 and 307, the Q output of D FF 301 is coupled to an input of AND gate 305 and the $\overline{Q}$ output of D FF 301 is coupled to an input of AND gate 307. The outputs of AND gates 305 and 307 are coupled to respective first inputs of OR gates 309 and 311. The "low count" and "high count" error pulses for up/down counter 55 of the structure of FIG. 1 are developed at the outputs of OR gates 309 and 311.

AND gates 305 and 307 are enabled in response to the high logic levels of the "synthesis enable" signal to respond to their other two inputs. If the frequency of the LO signal is high, D FF 301 will be set causing its Q output signal to be at the high logic level and its $\overline{Q}$ output signal to be at the low logic level during the LO measurement interval. Accordingly, when the positive-going "LO counter sample" pulse occurs just after the end of the measurement interval, it will be coupled through AND gate 305 and OR gate 309 to up/down counter 55 as the "high count" error pulse. If the frequency of the LO signal is low, D FF 301 will remain reset so that its Q output signal will be at the low logic level and its $\overline{Q}$ output signal will be at the high logic level at the end of the LO measurement interval. Accordingly, when the positive-going "LO counter sample" pulse occurs, it will be coupled through AND gate 307 and OR gate 311 to up/down counter 55 as the "low count" error pulse.

It will be noted that if the LO frequency is correct, D FF 301 will be set just prior to the end of the LO measurement interval. As a result, a "high count" error pulse will be produced even though the LO frequency is correct. The structure of FIG. 3 is purposely arranged to this end so that there will always be either a "low count" or "high count" error pulse produced during the synthesis mode of operation so that the tuning voltage always overshoots its final value. The purpose of this will be explained with reference to the logic implementation of tuning control unit 45.

AND gates 313 and 315 are used to generate an "IF low count" error pulse or a "IF high count" error pulse if the frequency of the picture carrier of the IF signal is low or high, respectively, during the AFT mode of operation. To this end the "AFT enable" and "IF counter sample" signals are coupled to respective inputs of AND gates 313 and 315, the Q output of D FF 301 is coupled to an input of AND gate 313 and $\overline{Q}$ output of D FF 301 is coupled to an input of AND gate 315. In addition, the output of an inverter 317 used to invert the "main count=0" signal is coupled to an input of AND gate 315. The outputs of AND gates 313 and 315 are coupled to respective second inputs of OR gates 309 and 311.

AND gates 313 and 315 cooperate with D FF 301 in substantially the same manner as AND gates 305 and 307 to produce "low count" and "high count" error pulses if the frequency of the IF picture carrier is low or high respectively. However, the presence of inverter 317 prevents AND gate 313 from coupling the "LO counter sample" pulse to OR gate 309 if the count of main counter 201 is zero, whereby the "main count=0/ " has the low logic level, at the end of the IF measurement interval. Thus, if the IF picture carrier frequency is correct, neither a "low count" or "high count" error pulse will be produced.

It is noted that the beginning of the measurement intervals are not synchronized with the respective frequency divided signals. Accordingly, although the correct number of positive-going pulse edges may be counted by main counter 201 during a measurement interval, there may be a frequency error corresponding to as much as one cycle of the respective frequency divided signal. This corresponds to an accuracy of ±250 kHz for the LO frequency measurement and of ±31.25 kHz for the IF frequency measurement. These accuracies have been found sufficient for tuning television receivers. The accuracies of the frequency measurements can be improved by either decreasing the division factor of the respective prescaler or by increasing the time duration of the respective measurement interval. The former is somewhat undesirable since it increases the frequency of the signal which frequency sampler 31 must process. The latter is also somewhat undesirable with respect to the frequency measurement of the IF signal since it may cause the IF measurement interval to extend into the teletext and test signal interval in which the IF picture carrier may, under some circumstances, be overmodulated for the reasons earlier noted.

AND gates 319 and 321 and an OR gate 323 are used in conjunction with detectors 213 and 215 of the structure of FIG. 2 and with D FF 301 to generate an "offset" pulse during the operation of the AFT FLL if the LO frequency has been caused to change from the value established during the previous operation of the synthesis FLL by a predetermined offset, e.g., ±1.25 mHz. During the LO frequency measurement, as earlier indicated each count of main down counter 201 corresponds to a 0.250 mHz increment. Therefore, the detection of a frequency offset greater than ±1.25 mHz requires the detection of a count within ±5 counts of zero.

As earlier noted, ">5" detector 213 generates a high logic level "main count>5" output signal if the count in main down counter 201 is greater than five at the end of the LO frequency measurement interval. The output signal of ">5" detector 215 is coupled to one input of an AND gate 319 which also receives the "AFT enable" signal, the "$\overline{\text{IF cycle}}$" signal, the signal developed at the $\overline{Q}$ output of D FF 301 and the "LO counter sample" signal at respective other inputs. When enabled by the high logic level of the "AFT enable" signal and the high logic level of the "$\overline{\text{IF cycle}}$" signal, AND gate 319 generates a positive-going pulse in response to the positive-going "LO counter sample" pulse if the count in main down counter 201 at the end of the LO frequency measurement interval is greater than five. Since after main down counter 201 has counted down to zero it continues to count down from the maximum count, coupling the $\overline{Q}$ output signal of D FF 301 to an input of AND gate 319 ensures that a positive-going pulse will not be produced by AND gate 319 in response to the "LO counter sample" pulse unless the count is actually greater than five above zero and not in response to the detection of a large count at the end of the measurement interval due to the count having crossed zero.

Also as earlier noted "<max.−4" detector 215 generates a high level logic "main count<max−4" output signal if main down counter 201 after a count of zero is reached is the maximum count to which counter 201 can count, detector 629 operates by detecting when the count in counter 201 falls below four less than the maximum count. The output signal of detector 215 is coupled to the one input of an AND gate 321 which also receives the "AFT enable" signal, the "$\overline{\text{IF cycle}}$" signal, the signal developed at the Q output of D FF 301 and the "LO counter sample" signal at respective other inputs. When enabled by the high logic level of the "AFT enable" signal and the high level of the "$\overline{\text{IF cycle}}$" signal, AND gate 321 generates a positive-going pulse in response to the positive-going "LO counter sample" pulse if the count of main down counter 201 at the end of the LO frequency measurement interval is less than four below the maximum count. Since the frequency measurement operation starts by enabling main down counter 201 to count down from a relatively large number, coupling the Q output signal of D FF 301 to an input of AND gate 321 ensures that a positive-going pulse will not be produced by AND gate 321 in response to the "LO counter sample" pulse unless the count has previously crossed zero and therefore actually is more than five below zero.

The outputs of AND gates 319 and 321 are coupled to respective inputs of OR gate 323. The positive-going "offset" pulse is generated at the output of OR gate 323 when a positive-going pulse is generated at the output of either one of AND gates 321 and 319.

Figure 4:
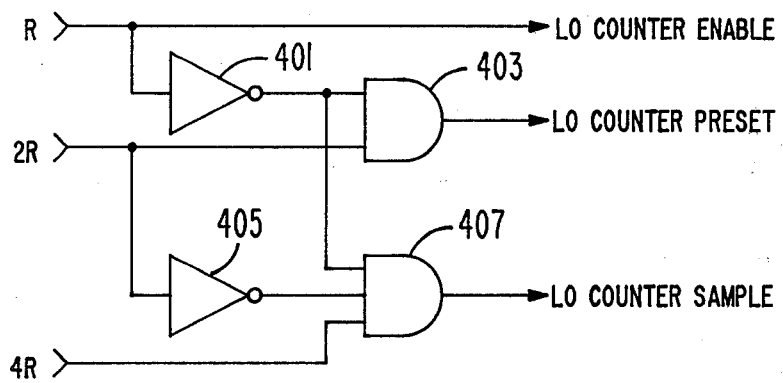
Figure 4A:
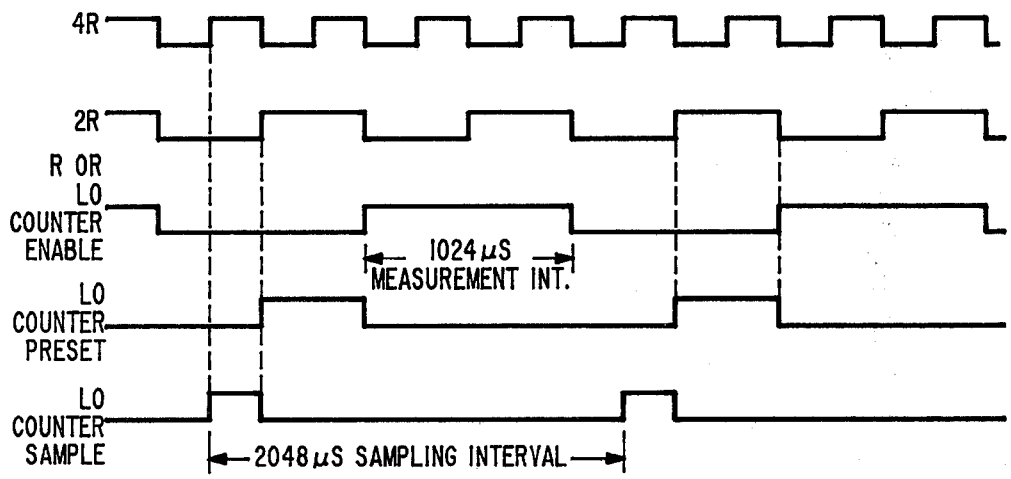

A logic arrangement for generating the LO counter "preset", "enable" and "sample" pulses illustrated in FIG. 4a is shown in FIG. 4. Specifically, an inverter 401 and an AND gate 403 combine the R and 2R timing signals to generate the "LO counter preset" pulses. The R timing signal, having a period of 2048 microseconds, is utilized as the "LO counter enable" signal. Inverter 401, an inverter 405 and AND gate 407 combine the R, 2R and 4R timing signals to generate the "LO counter sample" pulses.

Figure 5:
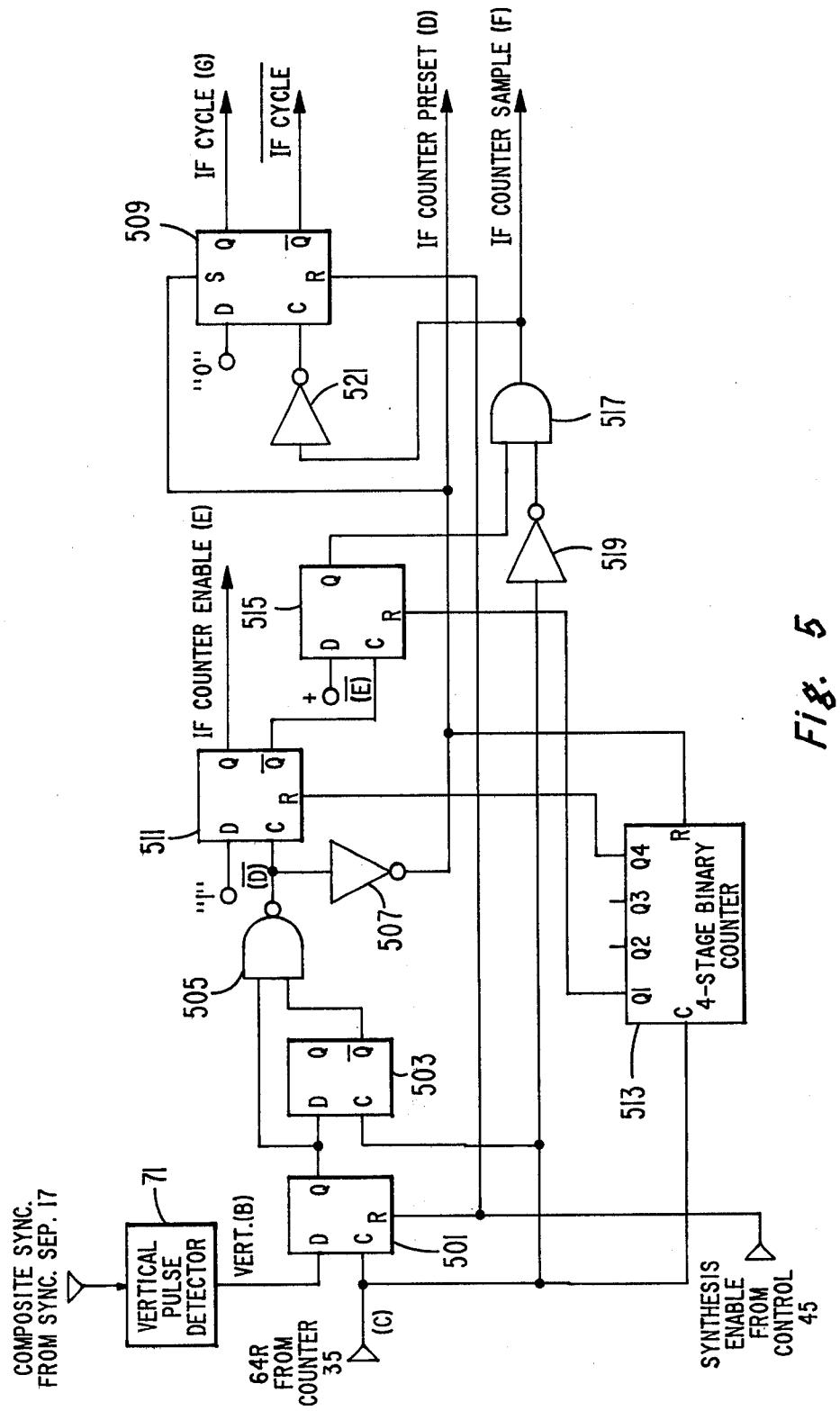

A logic arrangement for generating the IF counter "preset", "enable", "sample" pulses and "IF cycle" and "$\overline{\text{IF cycle}}$" signals illustrated in FIG. 5a is shown in FIG. 5. During the following description of FIG. 5, concurrent reference to FIG. 5 will be helpful.

As earlier noted, "vertical pulse" detector 71 of the structure of FIG. 1 generates a positive-going "vertical" pulse (waveform B) after the first vertical sync pulse during the vertical retrace interval. The "vertical" pulse is coupled to the data (D) input of a D FF 501. The 64R timing signal, (waveform C) having a period of 32 microseconds is coupled to the clock (C) input of D FF 501. D FF 501 is set causing its Q output to have a logic high level in response to the first positive-going edge of the 64R timing signal which occurs after the generation of the "vertical" pulse (waveform B).

The Q output of D FF 501 is coupled to the D input of a D FF 503. The 64R timing signal is coupled to the C input of D FF 501. D FF 503 is set, causing a low logic level to be developed at its $\overline{Q}$ output, in response to the second positive-going edge of the reference signal generated after the generation of the "vertical" pulse (waveform B). The Q output of D FF 501 and the $\overline{Q}$ output of D FF 503 are coupled to inputs of a NAND gate 505. Accordingly, a negative-going pulse, $\overline{D}$, having a width equal to the width of one cycle of the 64R timing signal, is generated at the output of NAND gate 505 after the first positive-going edge of the 64R timing signal which occurs after the generation of "vertical" pulse (waveform B). The output of NAND gate 505 is applied to an inverter 507 which produces the positive-going "IF counter preset" pulse (waveform D) in response to negative-going pulse $\overline{D}$.

The "IF counter preset" pulse is coupled to the set (S) input of a D FF 509. The "IF cycle" signal (waveform G) is developed at the Q output of D FF 509 and the "$\overline{IF\ cycle}$" signal is developed at the $\overline{Q}$ output of D FF 509. In response to the positive-going "IF counter preset" pulse D FF 509 is set thereby causing the "IF cycle" signal to have the high logic level and the "$\overline{IF\ cycle}$" signal have the low logic level.

Negative-going pulse $\overline{D}$ is coupled to the clock (C) input of a D FF 511. A high logic level ("1") is applied to the D input of D FF 511. The "IF counter enable" signal (waveform E) is generated at the Q output of D FF 511. D FF 511 is set in response to the positive-going edge of negative-going pulse $\overline{D}$ causing the "IF counter enable" signal developed at its Q output of D FF 511 to have the high logic level and the signal developed at its $\overline{Q}$ output to have the low logic level.

The duration of the high logic level of the "IF counter enable" signal, i.e., the duration of the IF measurement interval is determined by a four-stage binary counter 513. The "IF counter preset" pulse is coupled to the reset (R) input of counter 513 to reset to zero count condition prior to the measurement interval. Thereafter, counter 513 counts pulses of the 64R timing signal coupled to its clock (C) input. When eight periods of the 64R timing signal have been counted, a high logic level is developed at the output of its fourth stage (Q4). The Q4 output of counter 519 is coupled to the reset (R) input of D FF 511. In response to the high logic level of the signal generated at the Q4 output of counter 513, D FF 511 is reset thereby causing the "IF counter enable" developed at the Q output of D FF 511 to have the low logic level which ends the IF measurement interval. Since each period of the 64R timing signal is 32 microseconds long, the IF measurement interval is 8×32 or 256 microseconds long. The "IF counter preset" pulse is coupled to the reset (R) input of counter 513 to reset it to a zero count condition prior to the measurement interval.

The "IF counter sample" pulse (waveform F) is generated by a D FF 515, an AND gate 517 and an inverter 519. The $\overline{Q}$ output signal ($\overline{E}$) of D FF 511 is coupled to the clock (C) input of D FF 515. A high logic level ("1") is coupled to the data (D) input of D FF 515. The Q output of D FF 515 is coupled to one input of AND gate 517. The 64R timing signal is inverted by inverter 519 and the resulting signal coupled to the other input of AND gate 517. In response to the positive-going edge produced at the $\overline{Q}$ output of D FF 511 when the measurement interval ends, a high logic level is developed at the Q output of D FF 515 which enables AND gate 517. The signal produced at the output (Q1) of the first stage of counter 513 is coupled to the reset (R) input of D FF 515. Accordingly, D FF 515 is reset thereby ending the high logic level developed at its Q output and disabling AND gate 517 one cycle of the 64R timing signal after the end of the IF measurement interval. Thus, AND gate 517 is enabled to pass one pulse of the 64R timing signal to its output as the "IF counter sample" pulse after the IF measurement interval ends.

The "IF counter sample" pulse is coupled to an inverter 521. The output of inverter 521 is coupled to the clock (C) input of D FF 509. The data (D) input of D FF 509 receives the low logic level. Accordingly, in response to the negative-going edge of the "IF counter sample" pulse, D FF 509 is reset thereby causing the "IF cycle" signal developed at its Q output to have the low logic level and the "$\overline{IF\ cycle}$" signal developed at its $\overline{Q}$ output to have the high logic level.

The "synthesis enable" signal is coupled to the reset (R) inputs of D FFs 501 and 509. The high logic level of the "synthesis enable" signal prevents the generation of the IF counter "preset", "enable" and "sample" pulses and to cause the "$\overline{IF\ cycle}$" signal to have the high logic level during the synthesis mode of operation.

Figure 6:
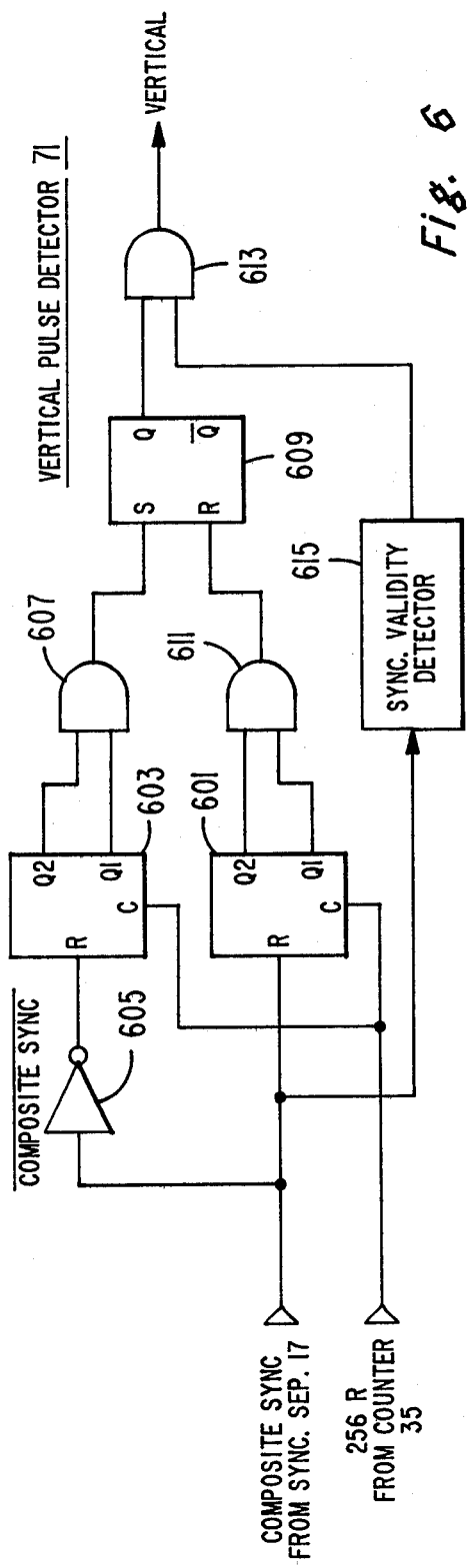

A logic implementation of vertical synchronization pulse detector 71 shown as a block in FIGS. 1 and 5 is shown in FIG. 6. During the description of FIG. 6 reference to the waveforms shown in FIG. 6a will be helpful.

The implementation of vertical synchronization pulse detector 71 shown in FIG. 6 includes two two-stage resettable binary counters 601 and 603. The 256R timing signal, having an eight microsecond period, is coupled to the clock (C) input of counters 601 and 603. The composite synchronization signal including horizontal and vertical synchronization and equalizing pulses is coupled to the reset (R) input of counter 601 and to the input of an inverter 605. The output of inverter 605 is coupled to the reset (R) input of counter 603.

The intervals between the consecutive positive-going, relatively narrow pulses of the output signal of inverter 605 correspond to the durations of the relatively broad, positive-going vertical sync pulses which occur during the vertical retrace interval. As will be seen from FIG. 6a, the duration of one vertical sync pulse approximately corresponds to the duration of three consecutive cycles of the 256R timing signal. Counter 603 is held reset in response to the high logic level of each positive-going pulse of the output signal of inverter 605. Thus, the presence of vertical sync pulses is indicated if three positive-going clock pulses are counted by counter 603 between consecutive positive-going reset pulses. To detect this occurrence, the outputs of the first and second stages of counter 603, Q1 and Q2, are coupled to inputs of an AND gate 607. When the signals developed at the Q1 and Q2 outputs of counter 603 both have high logic levels, AND gate 607 will produce a high logic level at its output. The output of AND gate 607 is coupled to the set (S) input of a S-R FF 609. The high logic level produced at the output of AND gate 607 causes S-R FF 409 to be set, thereby producing a high logic level at its Q output. The Q output of S-R FF 609 is coupled to one input of an AND gate 613. The output of a "sync validity" detector 615 is coupled to the other input of AND gate 613. The "vertical" pulse is produced at the output of AND gate 613 when S-R FF 609 is set and the high logic level is produced at the output of "sync validity" detector 615 as will be described below.

Figure 6A:
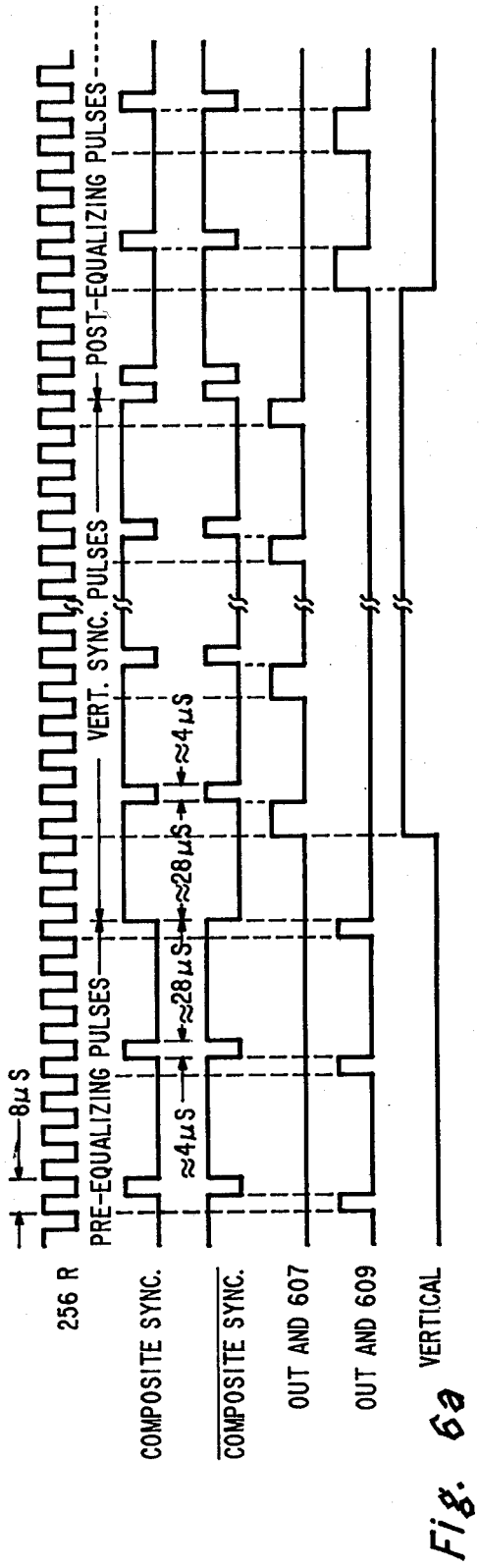

As will be seen from FIG. 6a, the interval between consecutive relatively narrow, positive-going post-equalizing pulses (as well as the interval between the consecutive relatively narrow, positive-going pre-equalizing pulses) approximately correspond to the duration of three consecutive cycles of the 256R timing signal. Counter 601 and an AND gate 611 are arranged in similar fashion to counter 603 and AND gate 607 to generate the high logic level when three clock pulses have been counted between two consecutive positive-going post-equalizing pulses and thereby detect the beginning of the post-equalizing interval. The output of AND gate 611 is coupled to the reset (R) input of S-R FF 609 to reset it, thereby ending the high logic level produced at the Q output of S-R FF 609.

It is noted that some sources of RF television signals, such as video games, may not provide pre-equalizing and post-equalizing pulses. However, the structure shown in FIG. 6 will operate in substantially the same manner described except that S-R FF 609 will be reset when three clock pulses are counted by counter 601 between consecutive horizontal sync pulses rather than between consecutive post-equalizing pulses.

Sync validity detector 615 is responsive to the composite sync signal and generates the high logic level output signal which enables AND gate 613 to produce the "vertical" pulse when the composite sync signal is correct and relatively noise-free. For this purpose "sync validity" detector 615 may simply comprise an average detector. Another suitable arrangement for "sync validity" detector 615 which operates by examining the frequency and period of the composite sync signal to determine its validity is described in allowed U.S. patent application Ser. No. 261,449 filed on May 8, 1981 in the name of M. P. French and J. Tults and assigned, like the present application, to RCA Corporation. In relatively noise-free environments detector 615 and AND gate 613 may be omitted. In that case the "vertical" pulse is directly produced at the Q output of S-R FF 609.

Figure 8:
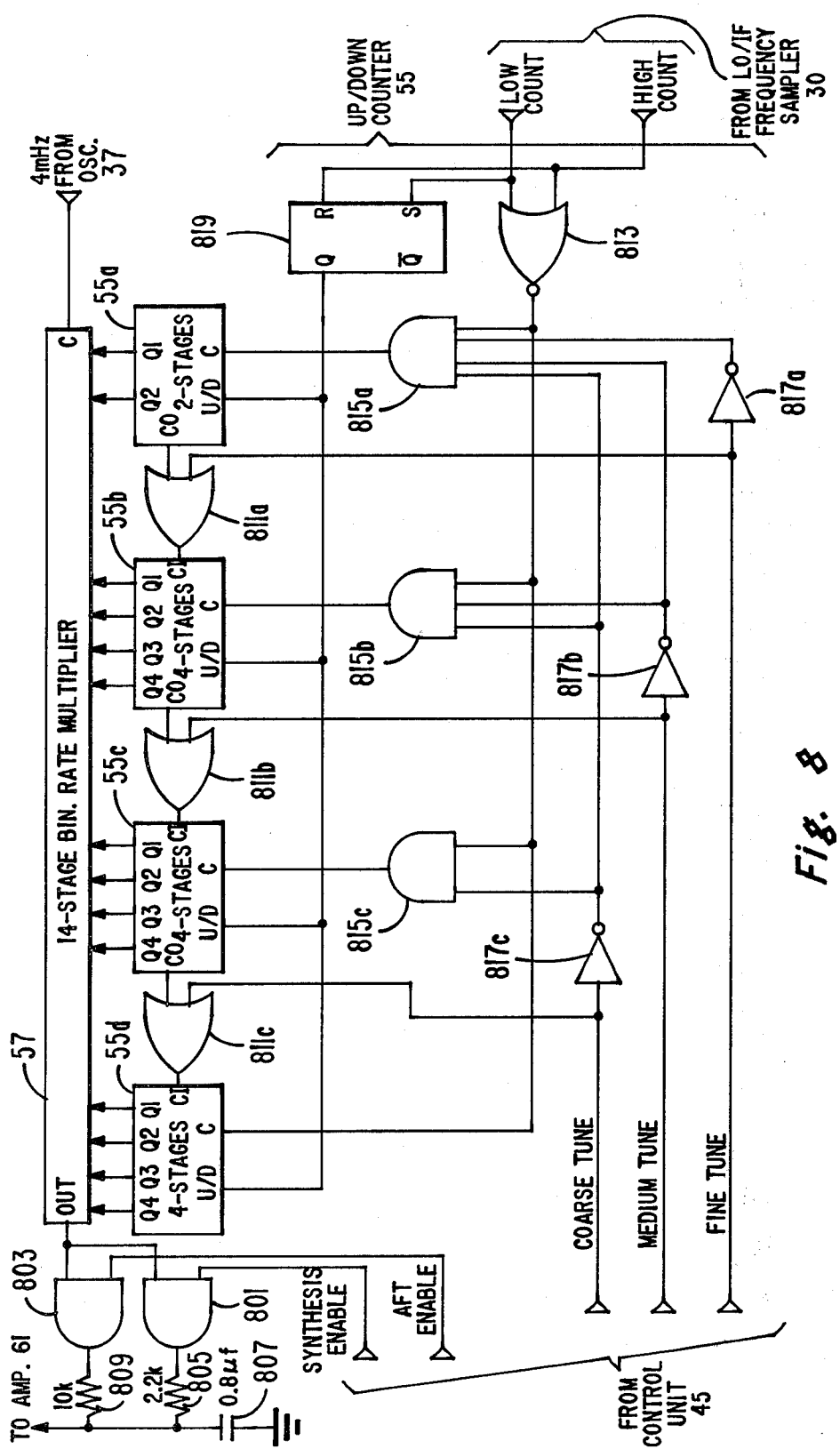
FIGS. 8 and 9 are schematics, in logic diagram form, of respective portions of the structure of FIG. 1 shown in block form.

Referring now to FIG. 8, a specific implementation of the structure including BRM 57, low pass filter 59 and up-down counter 55 will now be described.

The number of stages in BRM 57 is selected to ensure that the tuning voltage steps do not produce LO frequency steps that result in visible interference in the reproduced image. By way of example, fourteen stages have been found suitable for this purpose. The frequency of the clock signal for BRM 57 is selected to provide enough time for BRM 57 to complete its operating cycle and for the tuning voltage to change between the error pulses which occur once every field during the AFT mode of operation. As indicated by way of example in FIG. 1, 4 mHz has been found suitable for this purpose. As indicated above the synthesis mode of operation is partitioned into coarse, medium and fine tuning intervals in each of which the number of BRM states that can be changed is limited in order to ensure that the 4 mHz clock signal wil allow for adequate time for the tuning voltage to change between error pulses. Furthermore, selecting a 4 mHz clock for BRM 57, allows for the use of practical resistance and capacitance values for low pass filter (LPF) 59, as indicated in FIG. 8, consistent with ensuring that the worst case ripple in the tuning voltage will produce LO frequency fluctuations considerably less than those (e.g., 50 kHz fluctuations) which may result in visible interference.

Binary rate multiplier 57 may be constructed in a manner similar to a CD 4089 integrated circuit binary rate multiplier commercially available from RCA Corporation, Somerville, N.J.

Referring now to the implementation of low pass filter shown in FIG. 8, the output signal of BRM 57 is coupled to first inputs of AND gates 801 and 803. The "synthesis enable" control signal is coupled to the second input of AND gate 801 and the "AFT enable" control signal is coupled to the second input of AND gate 803. During the synthesis mode of operation the "synthesis enable" signal is at the high logic level thereby enabling AND gate 801 to couple the output signal of BRM 57 to a first low pass filter section of low pass filter 59 consisting of a resistor 805 and a capacitor 807. During the AFT mode of operation, the "AFT enable" signal is at the high logic level thereby enabling AND gate 803 to couple the output signal of BRM 57 to a second low pass filter section of low pass filter 59 consisting of a resistor 809 and capacitor 807. The junction of resistors 805 and 809 and capacitor 807 is coupled to the input of amplifier 61 which amplifies the DC voltage produced by low pass filter 59 as was indicated with respect to FIG. 1. Since the structure of low pass filter 59 is relatively simple, consisting simply of two resistors and a capacitor, a significant cost saving over that of the more complicated active low pass filter arrangements typically employed in phase lock loop tuning control systems, is achieved.

The implementation of up/down counter 55 shown in FIG. 8 is a fourteen-stage counter arrangement in which a two-stage up/down counter 55a, a four-stage up/down counter 55b, a four-stage up/down counter 55c and a four-stage up/down counter 55d are coupled in cascade, with the carry-out (CO) outputs of up/down counters 55a, 55b and 55c coupled through OR gates 811a, 811b and 811c to the carry-in (CI) inputs of up/down counters 55b, 55c and 55d, respectively. Counters 55a–55d may be constructed in a manner similar to a CD 4516 integrated circuit binary up/down counter commercially available from RCA Corporation, Somerville, N.J.

The "low count" or "high count" error pulses from frequency sampler 30 are coupled through a NOR gate 813 directly to the clock (C) input of up/down counter 55d and selectively to the clock inputs of up/down counters 55c, 55b and 55a through NOR gate 813 and AND gates 815c, 815b and 815a, respectively. The "coarse tune", "medium tune" and "fine tune" control signals are inverted by inverters 817c, 817b and 817a and the resulting signals are coupled to inputs of AND gates 815c, 815b and 815a, respectively. Accordingly, AND gates 815c, 815b and 815a are selectively disabled to couple the error pulses to the respective clock inputs in response to the high logic levels of "coarse tune", "medium tune" and "fine tune" control signals generated by tuning control unit 45.

When the "coarse tune" control signal has the high logic level, AND gates 815c, 815b and 815a are disabled and the error pulses are only coupled to the clock input of counter 55d. When the "medium tune" control signal has a high logic level, AND gates 815b and 815a are disabled and the error pulses are coupled only to the clock inputs of counters 55d and 55c. When the "fine tune" control signal has high logic level, AND gate 815a is disabled and the error pulses are coupled only to the clock inputs of counters 55d, 55c and 55b. When none of the "coarse tune", "medium tune" or "fine tune" control signals has a high logic level, the error pulses are coupled to the clock inputs of all of counters 55d, 55c, 55b and 55a. The "coarse tune", "medium tune" and "fine tune" control signals are also coupled to inputs of OR gates 811c, 811b and 811a and when at the high logic level provide high logic level carry-in signals to the carry-in inputs of counters 55d, 55c and 55b, respectively. As will be described in greater detail with respect to the structure of FIG. 9, the structure of tuning control unit 43 causes the "coarse tune", "medium tune", and "fine tune" control signals to have the high logic level during successive intervals as indicated in FIG. 9a. During the AFT mode of operation, all of the control signals are caused to have low logic levels so that the full fourteen bit resolution of counter 55 is available.

A S-R FF 819 receives the "high count" error pulses at its set (S) input and the "low count" error pulses at its reset (R) input and has its Q output coupled to the "up/-down" control inputs of counters 55a–55d. When "high count" error pulses are generated, S-R FF 819 is set causing a high logic level to be developed at its Q output. When "low count" error pulses are generated, S-R FF 819 is reset causing a low logic level to be developed at its Q output. When a high logic level is developed at the Q output of S-R FF 819, the contents of counters 55a–55d are caused to increase in response to the error pulses. When a low logic level is developed at the Q output of S-R FF 819, the contents of counters 55a–55d are caused to decrease in response to the error pulses.

Figure 9:
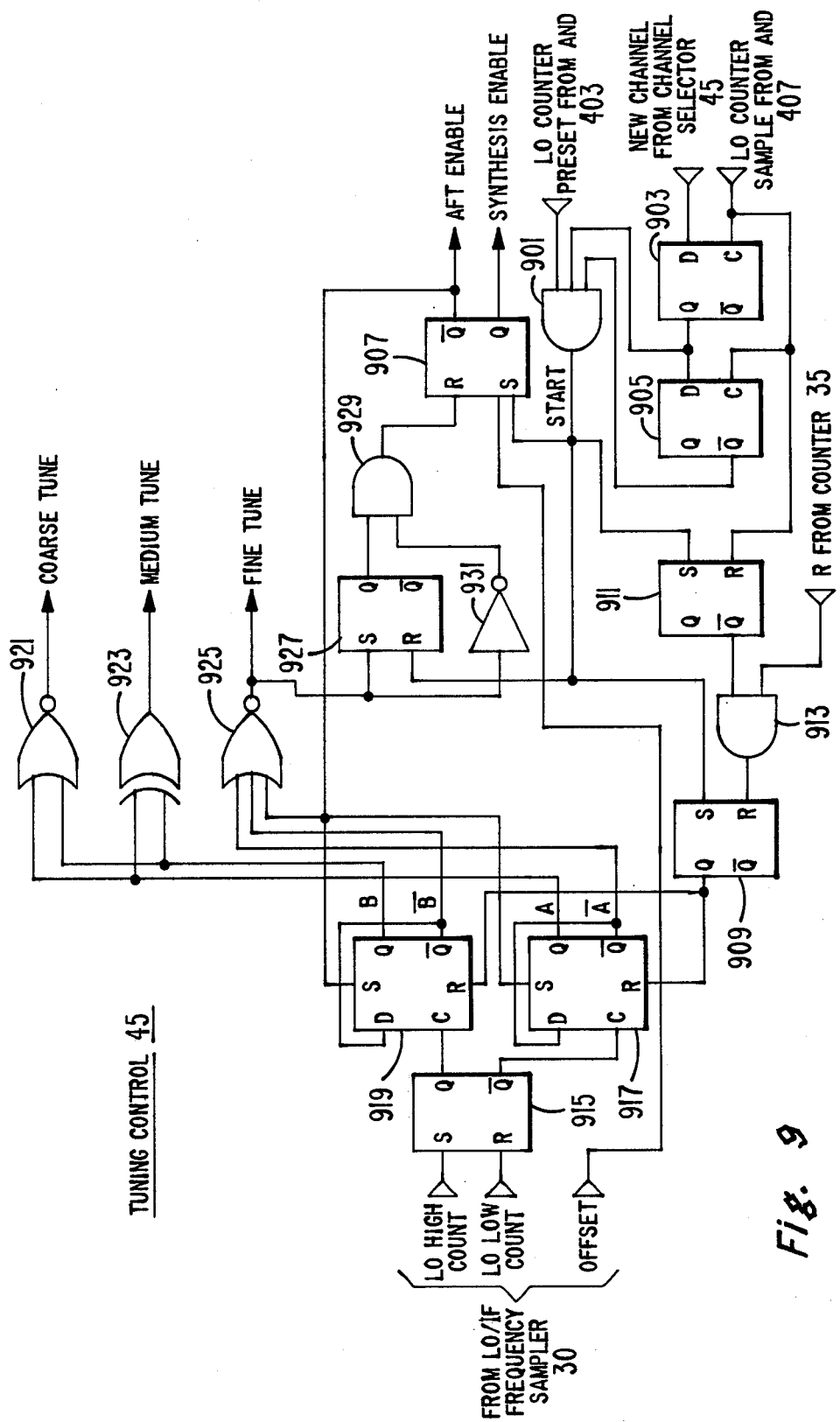
Figure 9A:
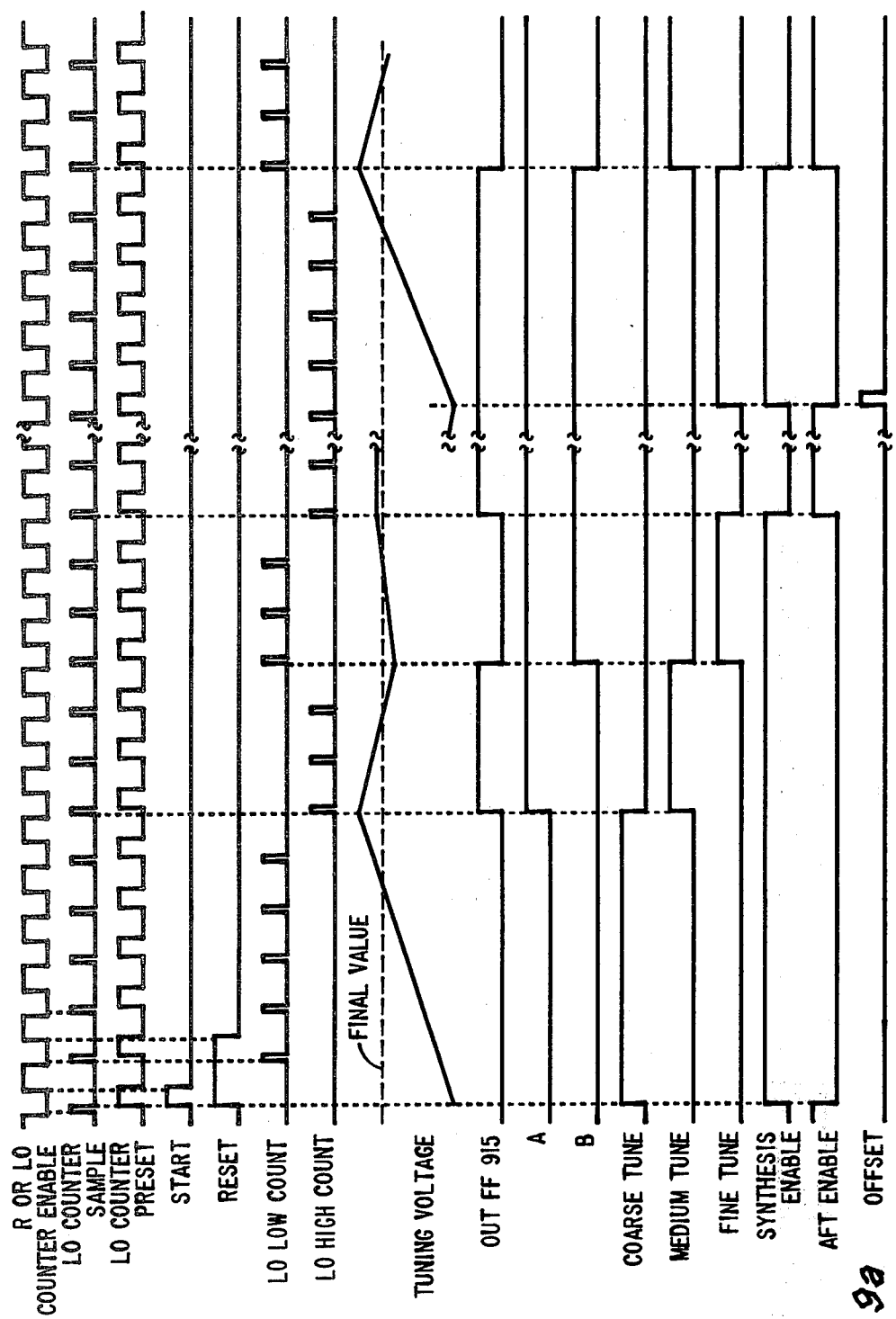
FIG. 9a shows graphical representations of waveforms of signals useful in understanding the operation of the structure shown in FIG. 9.

A logic implementation of tuning control logic unit 45 shown in block form in FIG. 1 is shown in FIG. 9. During the description of the structure of FIG. 9 reference to the waveforms shown in FIG. 9a will be helpful.

In the structure of FIG. 9, the logic configuration comprising an AND gate 901 and D FFs 903 and 905 selects one of the "LO counter preset" pulses to produce a "start" pulse after the high logic level of the "new channel" signal is generated when a new channel is selected. AND gate 901 is enabled in response to the signals developed at the Q output of D FF 903 and the $\overline{Q}$ output of DFF 905 for a time interval long enough to allow just one "preset" pulse to be coupled from its input to its output as the "start" pulse as indicated in FIG. 9a.

The "start" pulse is coupled to one set (S) input of a S-R FF 907 which in response generates the high logic level "synthesis enable" signal at its Q output.

The "start" pulse is also coupled to respective set (S) inputs of S-R FFs 909 and 911 which cooperate with an AND gate 913 to generate a positive-going "reset" pulse which spans one "LO counter sample" pulse as is shown in FIG. 9a. The purpose of this will be described below.

A S-R FF 915, a D FF 917 and a D FF 919 together with a NOR gate 921, an exclusive OR gate 923 and a NOR gate 925 generate the "coarse tune", "medium tune" and "fine tune" control signals for the structure shown in FIG. 8. Specifically, the "coarse tune" control signal is caused to have the high logic level in response to the "new channel" signal and thereafter the "medium tune" and "fine tune" control signals are caused to have the high logic level one at a time in sequence in response to respective changes in the sense of the frequency error detected by LO frequency sampler 31 as manifested by corresponding alternate generations of the "low count" and "high count" pulses.

Referring now specifically to the structure shown in FIG. 9, the "high count" and "low count" error pulses generated by frequency sampler 30 are coupled to the set (S) and reset (R) inputs, respectively, of S-R FF 915. The $\overline{Q}$ and Q outputs of S-R FF 915 are coupled to the clock (C) inputs of D FFs 917 and 919, respectively. The respective $\overline{Q}$ outputs and D inputs of D FFs 917 and 919 are coupled together to configure D FFs 917 and 919 as "toggle" flip-flops. The "reset" pulse is coupled to the reset inputs of D FFs 917 and 919. The "AFT enable" signal generated at the $\overline{Q}$ output of S-R FF 907 is coupled to the set inputs of D FFs 917 and 919. The output signal developed at the Q output of D FF 917, identified as A, is coupled to a first input of NOR gate 921 and to a first input of exclusive OR (XOR) gate 923 and the signal developed at the $\overline{Q}$ output of D FF 917, identified as $\overline{A}$, is coupled to a first input of NOR gate 925. The signal developed at the Q output of D FF 919, identified as B, is coupled to a second input of NOR gate 921 and to a second input of XOR gate 923 and the signal developed at the $\overline{Q}$ output of D FF 919, identified as $\overline{B}$, is coupled to a second input of XOR gate 925. The "AFT enable" signal is coupled to a third input of NOR gate 925.

During the AFT mode of operation, when the "AFT enable" signal has the high logic level, NOR gate 925 is disabled from responding to the $\overline{A}$ and $\overline{B}$ signals since it always produces the low logic level at its output in response to the high logic level "AFT enable" signal. During the synthesis mode of operation, when the "AFT enable" signal has the low logic level, NOR gate 925 is enabled to respond to the levels of the $\overline{A}$ and $\overline{B}$ signals. The "coarse tune" signal is developed at the output of NOR gate 921. The "medium tune" signal is developed at the output of XOR gate 923. The "fine tune" signal is developed at the output of NOR gate 925.

The positive-going "reset" pulse generated in response to the high logic level "new channel" signal causes both of D FFs 917 and 919 to be reset. As a result, the signals A and B are both at the low logic level and low logic levels in response to the "positive-going" reset the "coarse tune" signal, developed at the output of NOR gate 921, has the high logic level. At the same time, the "medium tune" signal, developed at the output of XOR gate 923, is at the low logic level and the "fine tune" signal, developed at the output of OR gate 925, is at the low logic level.

During the coarse tuning interval the frequency of the local oscillator signal will be either higher or lower than it should be and either "low count" or "high count" error pulses, respectively, will be consecutively generated. By way of example, it is assumed that the LO frequency is lower than it should be after a new channel is selected so that "low count" error pulses are generated as is indicated in FIG. 9a. Thereafter, the operation of the LO frequency sampler 31 in conjunction with up/down counter 55, BRM 57, LPF 59 and amplifier 61 causes the tuning voltage and thereby the LO frequency to increase when the frequency of the LO signal overshoots its final or correct value, "high count" rather than "low count" error pulses will be generated. This causes S-R FF 915 to be reset thereby causing a positive-going pulse to be produced at its $\overline{Q}$ output. This causes D FF 917 to be set thereby causing the A signal to have the high logic level and the $\overline{A}$ signal to have the low logic level. At this point, B still has the low logic level and $\overline{B}$ still has the high logic level. As a result, the "coarse tune" signal has the low logic level, the "medium tune" signal has the high logic level and the "fine tune" signal has the low logic level.

In response to the "high count" error pulses, the LO frequency is caused to decrease. When the frequency of the LO signal again overshoots its final value, "low count" error pulses will once again be generated instead of "high count" error pulses. This again causes S-R FF 915 and D FF 919 to be set so that A and B are both at the high logic level and $\overline{A}$ and $\overline{B}$ are both at the low logic level. As a result, the "coarse tune" and "medium tune" signals will be at the low logic level and the "fine tune" signal will be at the high logic level.

As earlier noted, the logic including the structural elements 901 through 913 cause the "reset" pulse to span the first "sample" pulse and therefore the first "high count" or "low count" error pulse generated after the generation of the high logic level "new channel" signal. This ensures that the states of FFs 917 and 919 will not be changed until the sense of the frequency correction changes under normal operating conditions. If the "reset" pulse were not to span the first error pulse, a change from one type of error pulse to the other could occur immediately after the selection of a new channel due to initially erratic operating conditions. This would cause the states of S-R FF 915 and one of D FFs 917 and 919 to change thereby upsetting the proper generation sequence for the "coarse tune", "medium tune" and "fine tune" control signals.

The output of NOR gate 925 is applied to the set input of a S-R FF 927. The Q output of S-R FF 927 is coupled to one input of an AND gate 929. The output of NOR gate 925 is also coupled to the input of an inverter 931, the output of which is coupled to a second input of AND gate 929. The output of AND gate 929 is coupled to the reset input of S-R FF 907. As earlier noted, the "synthesis enable" signal is developed at the Q output of S-R FF 907 and the "AFT enable" signal is developed at the $\overline{Q}$ output of S-R FF 907. In response to the high logic level "fine tune" signal, S-R FF 927 is set causing its Q output to have the high logic level which enables AND gate 929. When the "fine tune" signal is caused to have the low logic level, a corresponding high logic level is developed by inverter 931 and coupled through enabled AND gate 929 to the reset input of S-R FF 907. The latter causes the "AFT enable" signal developed at the $\overline{Q}$ output of S-R FF 907 to have the high logic level. The "start" pulse is coupled to the reset input of S-R FF 927 and causes S-R FF 927 to be reset. This disables AND gate 929 and thereby prevents the development of the low logic level at the output of NOR gate 925 during the synthesis mode of operation from causing S-R FF 907 to be reset until after the generation of the high logic level "fine tune" signal.

The high logic level "AFT enable" signal causes D FFs 917 and 919 to remain set during the AFT mode of operation. As a result, A and B remain at the high logic level and $\overline{A}$ and $\overline{B}$ remain at the low logic level during the AFT mode of operation. As earlier indicated, the high logic level "AFT enable" signal also disables NOR gate 925 from responding to signals $\overline{A}$ and $\overline{B}$ by causing its output to have the low logic level. As a result, during the AFT mode, all of the "coarse tune", "medium tune" and "fine tune" control signals have the low logic level during the AFT mode of operation.

The "offset" signal is coupled to a second set (S) input of S-R FF 907. S-R FF 907 is set in response to the positive-going "offset" pulse thereby causing the "synthesis enable" signal to have the high logic level and the "AFT enable" signal to have the low logic level. This ends the AFT mode of operation and reinitiates the synthesis mode of operation. In response to the low logic level "AFT enable" signal, NOR gate 925 is enabled to respond to the $\overline{A}$ and $\overline{B}$ signals which are at the low logic level (having been caused to be in that condition in response to the high logic level "AFT enable" signal). As a result, the "fine tune" control signal is caused to be at the high logic level. Thereafter, when the LO frequency overshoots its final value, one of D FFs 917 and 919 is reset. This causes the "fine tune" signal to have the low logic level. As a result, as described above when the high logic level of the "fine tune" signal ends, S-R FF 907 is reset causing the "AFT enable" signal to have the high logic level and the "synthesis enable" signal to have the low logic level.

Thus, what has been described is a counting arrangement useful in a frequency locked loop type of tuning system for measuring the frequency of the local oscillator signal including a main down counter and an auxiliary down counter. In the specific embodiment described, prior to the measurement interval the channel number is located in the main down counter and a number which is related to the frequency separation, S, in mHz, between the channels by the relationship:

$$PS+P$$

where P is an integer greater than zero, is loaded into the auxiliary down counter. During the measurement interval, the main down counter is enabled to count down from the channel number in response to the local oscillator signal. Each time the count of the main down counter equals zero, the count in the auxiliary counter is reduced by one and the channel number is again loaded into the main counter. When the count in the auxiliary down counter equals P, a band dependent constant is loaded into the main counter. Thereafter, each time the count of the main down counter equals zero the band dependent number is again loaded into the main counter and the count of the auxiliary down counter is again reduced by one until the count of the auxiliary down counter equals one. After the end of the measurement interval the count in the main counter is examined to generate an error signal from which the tuning voltage is generated.

It will be appreciated, that although in the specific embodiment described the main down counter is first loaded with the channel number and thereafter loaded with the band dependent number, the arrangement may be modified so that main down counter is first loaded with the band dependent number and thereafter loaded with the channel number. In that case the channel number is loaded into the main down counter when the count in the auxiliary counter equals PS. These and other modifications are intended to be within the scope of the present invention defined by the following claims.

What is claimed is:

1. In a television receiver including an RF input for receiving a plurality of RF signals corresponding to respective channels in frequency bands within the television range, each of said RF signals having a picture carrier; a RF stage for selecting one of said RF signals corresponding to a selected channel in response to a tuning control signal; a local oscillator for generating a local oscillator (LO) signal having a frequency corresponding to said selected channel in response to said tuning control signal; a mixer for combining said selected RF signal and said LO signal to produce an IF signal having a picture carrier corresponding to that of said selected RF signal; tuning control apparatus for generating said tuning control signal comprising:

a main down counter having a clock input;

coupling means for coupling said LO signal to said clock input of said main counter;

said main down counter counting in response to said LO signal when enabled to do so during an LO measurement interval;

main counter presetting means coupled to said main down counter means for selectively presetting said main counter to one of a first initial count corresponding to the channel number of the selected channel or a second initial count corresponding to the particular frequency band of the selected channel prior to said LO measurement interval;

said main counter presetting means presetting said main down counter to said one of said first and second initial counts whenever said main down counter having a clock input has counted to zero;

an auxiliary down counter;

auxiliary down counter presetting means for presetting said auxiliary counter to an initial count equal to (P)(S)+(P), where P is an integer number and S is the frequency spacing, in mHz, between said channels within said frequency bands, prior to auxiliary down counter control means coupled to said clock input of said auxiliary down counter and responsive to the count of the main down counter and said auxiliary down counter for causing said LO measurement interval;

said auxiliary down counter to count whenever said main down counter has counted to zero during said LO measurement interval and to be stopped from counting when said auxiliary down counter has counted to one during said LO measurement interval;

said main presetting means presetting said main down counter to the other one of said first and second initial counts when said auxiliary counter means has counted to P if said main down counter is preset to said first initial count and to (P)(S) if said main down counter is preset to said second initial count during said LO measurement interval;

count evaluating means coupled to said main down counter for evaluating the relationship between the count of said main counter at the end of said measurement interval and zero; and tuning control signal generating means coupled to said count evaluating means for generating said tuning control signal in response to said relationship between the count of said main counter at the end of said LO measurement interval and zero.

2. The tuning apparatus recited in claim 1 wherein:

said count evaluating means includes a zero count detecting means coupled to said main down counter for detecting when the count of said main down counter equals zero; a one count detecting means coupled to said auxiliary down counter for detecting when the count of said auxiliary down counter equals one; and storage means for storing an indication that the count of said main down counter has reached zero during the interval when the count of said auxiliary down counter was one.

3. The tuning apparatus recited in claim 2 wherein:

said coupling means includes input selection means for selectively coupling said LO signal to said main down counter during said LO measurement interval and said IF signal to said main down counter during an IF measurement interval;

said main down counter counts in response to said IF signal during said IF measurement interval;

said main counter presetting means presets said main down counter to a third initial count corresponding to the nominal frequency of said IF picture carrier prior to said IF measurement interval;

said auxiliary counter presetting means presets said auxiliary down counter to an initial count equal to Q, where Q is an integer, prior to said IF measurement interval;

said auxiliary down counter being caused to count whenever said main down counter has counted to zero during said IF measurement interval and being stopped from counting when said auxiliary counter has counted to one during said IF measurement interval; and said main counter presetting means presetting said main down counter to said third initial count whenever said main down counter reaches a count of zero during said IF measurement interval.

4. The tuning apparatus recited in claim 3 wherein:

said LO and IF signals are coupled to said main counter through respective prescalers.

5. The tuning apparatus recited in claim 4 wherein:

said main down counter is a decimal down counter; and said auxiliary down counter is a binary down counter.

6. The tuning apparatus recited in claim 5 wherein:

said integers P and Q are equal.

* * * * *

United States Patent [19]

Lehmann

[11] 4,442,548

[45] Apr. 10, 1984

[54] TELEVISION RECEIVER TUNING CIRCUIT TUNABLE OVER A WIDE FREQUENCY RANGE

[75] Inventor: William L. Lehmann, Indianapolis, Ind.

[73] Assignee: RCA Corporation, New York, N.Y.

[21] Appl. No.: 378,115

[22] Filed: May 14, 1982

[51] Int. Cl.³ .................... H04B 1/16; H03F 3/191
[52] U.S. Cl. ................... 455/195; 455/179; 455/197; 334/15; 330/305
[58] Field of Search ............ 455/179, 180, 195, 197, 455/191, 187, 340, 285, 286, 291, 293; 358/191.1; 334/15; 330/302, 305

[56] References Cited

U.S. PATENT DOCUMENTS

| | | | |
|---|---|---|---|
| 3,555,431 | 1/1971 | Wilcox | 455/187 |
| 3,593,154 | 7/1971 | Blass | 455/179 |
| 3,611,154 | 10/1971 | Kupfer | 455/197 |
| 3,622,891 | 11/1971 | Leland | 325/381 |
| 3,696,302 | 10/1972 | Gossard | 325/432 |
| 4,023,106 | 5/1977 | Utsunomiya | 455/179 |
| 4,048,598 | 9/1977 | Knight | 334/15 |
| 4,214,217 | 7/1980 | Saito et al. | 334/45 |
| 4,215,372 | 7/1980 | Suzuki | 358/188 |
| 4,291,290 | 9/1981 | Ijichi et al. | 334/1 |
| 4,361,909 | 11/1982 | Theriault | 455/286 |
| 4,368,541 | 1/1983 | Evans | 455/186 |

OTHER PUBLICATIONS

*RCA Television Service Data Supplement*, Chassis CTC 110 Series, File 1981-C-1-S5, pp. 1, 5-7.
*RCA Television Product Technical Manual*, May 1981, pp. 25-27.

*Primary Examiner*—Jin F. Ng
*Attorney, Agent, or Firm*—Paul J. Rasmussen; Clement A. Berard, Jr.; Peter M. Emanuel

[57] ABSTRACT

A radio frequency (RF) amplifier including a resonant circuit having a peaked response is tunable in response to a tuning voltage to select RF carriers over a wide range of frequencies and includes an additional resonant circuit for improving its response at the low frequency end of that range. The additional resonant circuit has a peaked response tunable in response to the tuning voltage in tracking relationship to that of the first resonant circuit. The tracking relationship is desirably selected so that the additional resonant circuit does not become tuned to a frequency which is an integral sub-multiple of the frequency of a selected RF carrier.

11 Claims, 2 Drawing Figures

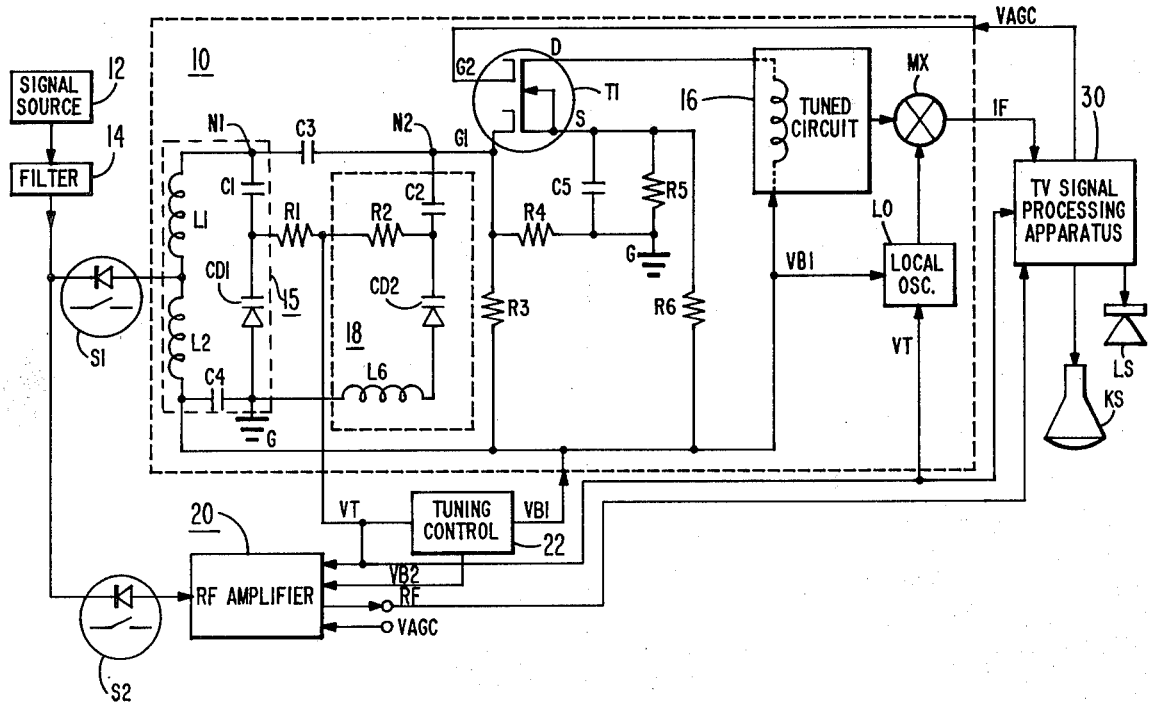

UNITED STATES PATENT AND TRADEMARK OFFICE
CERTIFICATE OF CORRECTION

PATENT NO. : 4,442,547

DATED : April 10, 1984

INVENTOR(S) : Juri Tults

It is certified that error appears in the above-identified patent and that said Letters Patent is hereby corrected as shown below:

Column 1, line 10: the period is missing at the end of the sentence - please add a period.

Column 8, line 62, "auxiliary count = 1" should not have a line over it; line 65, "auxiliary count = 1" should have a line over it.

Column 21, line 59 "wil" should be --will--.

Column 27, Claim 1, line 23 "having a clock input" should be deleted; line 24, after "counter" insert --having a clock input--; lines 30-34, "auxiliary down counter control means coupled to said clock input of said auxiliary down counter and responsive to the count of the main down counter and said auxiliary down counter for causing" should be deleted; and at line 36, before said (first occurrence) insert --auxiliary down counter control means coupled to said clock input of said auxiliary down counter and responsive to the count of the main down counter and said auxiliary down counter for causing--.

Signed and Sealed this

Nineteenth Day of February 1985

[SEAL]

Attest:

DONALD J. QUIGG

*Attesting Officer*  *Acting Commissioner of Patents and Trademarks*